(12) United States Patent
Song et al.

(10) Patent No.: US 10,916,584 B2
(45) Date of Patent: Feb. 9, 2021

(54) SEMICONDUCTOR DEVICE INCLUDING A DATA STORAGE PATTERN AND A METHOD OF MANUFACTURING THE SAME

(71) Applicant: SAMSUNG ELECTRONICS CO., LTD., Suwon-si (KR)

(72) Inventors: Seul Ji Song, Yongin-si (KR); Il Mok Park, Seoul (KR); Kyu Sul Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/513,925

(22) Filed: Jul. 17, 2019

(65) Prior Publication Data

US 2020/0243605 A1 Jul. 30, 2020

(30) Foreign Application Priority Data

Jan. 28, 2019 (KR) .................. 10-2019-0010762

(51) Int. Cl.
*H01L 27/24* (2006.01)
*H01L 45/00* (2006.01)

(52) U.S. Cl.
CPC ...... *H01L 27/2463* (2013.01); *H01L 27/2427* (2013.01); *H01L 45/06* (2013.01); *H01L 45/1233* (2013.01); *H01L 45/1253* (2013.01); *H01L 45/144* (2013.01); *H01L 45/1683* (2013.01)

(58) Field of Classification Search
CPC ............. H01L 27/2463; H01L 45/1253; H01L 45/1233; H01L 45/1683; H01L 45/06; H01L 45/144; H01L 27/2427
See application file for complete search history.

(56) References Cited

U.S. PATENT DOCUMENTS

| | | | |
|---|---|---|---|
| 8,343,798 B2 | 1/2013 | Choi et al. |
| 8,557,627 B2 | 10/2013 | Oh et al. |
| 8,871,559 B2 | 10/2014 | Horii et al. |
| 9,337,420 B2 | 5/2016 | Kim et al. |
| 2011/0186798 A1 | 8/2011 | Kwon et al. |
| 2013/0030296 A1 | 1/2013 | Miyaki |

(Continued)

FOREIGN PATENT DOCUMENTS

KR 10-2007-0058906 6/2007

*Primary Examiner* — David Vu
(74) *Attorney, Agent, or Firm* — F. Chau & Associates, LLC

(57) ABSTRACT

A semiconductor device including: first conductive lines on a substrate and extending in a first direction; second conductive lines on the first conductive lines and extending in a second direction; data storage structures between the first and second conductive lines, wherein each of the data storage structures includes a lower data storage electrode, a data storage pattern, and an upper data storage electrode, wherein a width of an upper portion of the lower data storage electrode is smaller than a width of a lower portion of the lower data storage electrode, a width of an upper portion of the data storage pattern is greater than a width of a lower portion of the data storage pattern, and the width of the upper portion of the lower data storage electrode is different from the width of the lower portion of the data storage pattern.

20 Claims, 33 Drawing Sheets

(56) References Cited

U.S. PATENT DOCUMENTS

2013/0126510 A1* 5/2013 Oh .................... H01L 45/1233
219/209
2014/0374684 A1 12/2014 Jung et al.
2017/0104154 A1 4/2017 Kim et al.
2018/0159032 A1 6/2018 Park et al.

* cited by examiner

SEMICONDUCTOR DEVICE INCLUDING A DATA STORAGE PATTERN AND A METHOD OF MANUFACTURING THE SAME

CROSS-REFERENCE TO RELATED APPLICATION

This application claims priority under 35 U.S.C. § 119 to Korean Patent Application No. 10-2019-0010762 filed on Jan. 28, 2019 in the Korean Intellectual Property Office, the disclosure of which is incorporated by reference herein in its entirety.

TECHNICAL FIELD

Exemplary embodiments of the present inventive concept relate to a semiconductor device and a method of manufacturing the same, and particularly, to a semiconductor device including a data storage pattern and a method of manufacturing the same.

DISCUSSION OF RELATED ART

Next generation memory devices such as a phase-change random access memory (PRAM), and the like, have been developed to implement high performance and operate at low power. Such next generation memory devices are manufactured using data storage materials, which have a changeable or maintainable resistance value. For example, some of these devices may have a resistance value that changes in accordance with current or voltage, while others may maintain a resistance value when current or voltage is shut off. To increase integration density of next generation memory devices, memory cells are arranged in a three-dimensional (3D) structure. However, this 3D arrangement of memory cells can lead to unexpected defects and reduction in reliability, for example.

SUMMARY

According to an exemplary embodiment of the present inventive concept, a semiconductor device includes first conductive lines disposed on a substrate and extending in a first direction along an upper surface of the substrate; second conductive lines disposed on the first conductive lines and extending in a second direction crossing the first direction and along the upper surface of the substrate; first data storage structures disposed between the first conductive lines and the second conductive lines, wherein each of the first data storage structures includes a first lower data storage electrode, a first data storage pattern on the first lower data storage electrode, and a first upper data storage electrode on the first data storage pattern; and a first etch stop layer adjacent to lower side surfaces of the first data storage pattern and extending in the first direction and the second direction, wherein a width of an upper portion of the first lower data storage electrode is smaller than a width of a lower portion of the first lower data storage electrode in the second direction, a width of an upper portion of the first data storage pattern is greater than a width of a lower portion of the first data storage pattern in the second direction, and the width of the upper portion of the first lower data storage electrode is different from the width of the lower portion of the first data storage pattern in the second direction.

According to an exemplary embodiment of the present inventive concept, a semiconductor device includes a first conductive line disposed on a substrate and extending in a first direction parallel to an upper surface of the substrate; a second conductive line disposed on the first conductive line and extending in a second direction perpendicular to the first direction and parallel to the upper surface of the substrate; a first data storage structure and a first selector structure disposed between the first conductive line and the second conductive line and connected to each other in series; and a first etch stop layer adjacent to side surfaces of the first data storage structure and extending in the first direction and the second direction, wherein the first data storage structure includes a first lower data storage electrode, a first data storage pattern, and a first upper data storage electrode, and wherein slopes of side surfaces of the first lower data storage electrode are different from slopes of side surfaces of the first data storage pattern, and a width of an upper portion of the first lower data storage electrode is different from a width of a lower portion of the first data storage pattern.

According to an exemplary embodiment of the present inventive concept, a method of manufacturing a semiconductor device includes forming a first conductive line extending in a first direction parallel to a surface of a substrate on the substrate; forming lower data storage electrodes on the first conductive line; forming an etch stop layer and a mold insulating layer on the lower data storage electrodes; forming a first hard mask pattern on the mold insulating layer, the first hard mask pattern extending in a second direction perpendicular to the first direction and parallel to the surface of the substrate; forming first spacers on side surfaces of the first hard mask pattern, the first spacers extending in the second direction; forming a second hard mask layer on the first hard mask pattern and the first spacers; forming a third hard mask pattern on the second hard mask layer, the third hard mask pattern extending in the first direction; forming second spacers on side surfaces of the third hard mask pattern, the second spacers extending in the first direction; forming preliminary holes by etching the first spacers using the second spacers; forming holes by etching the mold insulating layer exposed by the preliminary holes; and forming data storage patterns and upper data storage electrodes in the holes.

According to an exemplary embodiment of the present inventive concept, a semiconductor device includes a first conductive line disposed on a substrate; a second conductive line disposed on the substrate; and a data storage structure disposed between the first conductive line and the second conductive line, the data storage structure including a data storage pattern disposed between a first data storage electrode and a second data storage electrode, wherein a lower portion of the data storage pattern is wider than a width of an upper portion of the first data storage electrode, and wherein the data storage pattern is tapered.

BRIEF DESCRIPTION OF THE DRAWINGS

The above and other features of the present inventive concept will be more clearly understood by describing in detail exemplary embodiments thereof with reference to the accompanying drawings, in which:

FIG. 9 to 21 are diagrams illustrating a method of manufacturing a semiconductor device according to an exemplary embodiment of the present inventive concept, wherein FIGS. 9, 11, 13, 15, 17, 19, 21, 23, 25, and 27 are diagrams illustrating a method of manufacturing a semiconductor device according to an exemplary embodiment of the present inventive concept, viewed from the top, and FIGS. 10, 12, 14, 16, 18, 20, 22, 24, 26, and 28 are cross-sectional diagrams illustrating a method of manufacturing a semiconductor device according to an exemplary embodiment of the present inventive concept;

DETAILED DESCRIPTION OF THE EMBODIMENTS

Hereinafter, exemplary embodiments of the present inventive concept will be described in detail with reference to the accompanying drawings.

Figure 1:
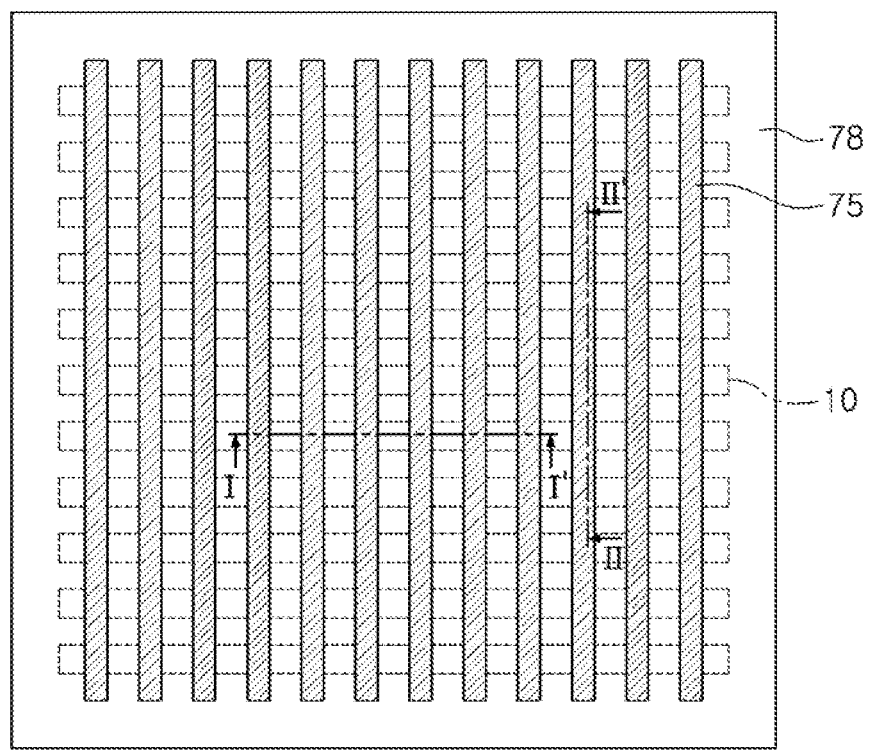
FIG. 1 is a diagram illustrating a semiconductor device according to an exemplary embodiment of the present inventive concept, viewed from the top.
Figure 1:
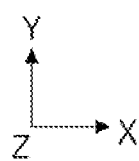
Figure 2:
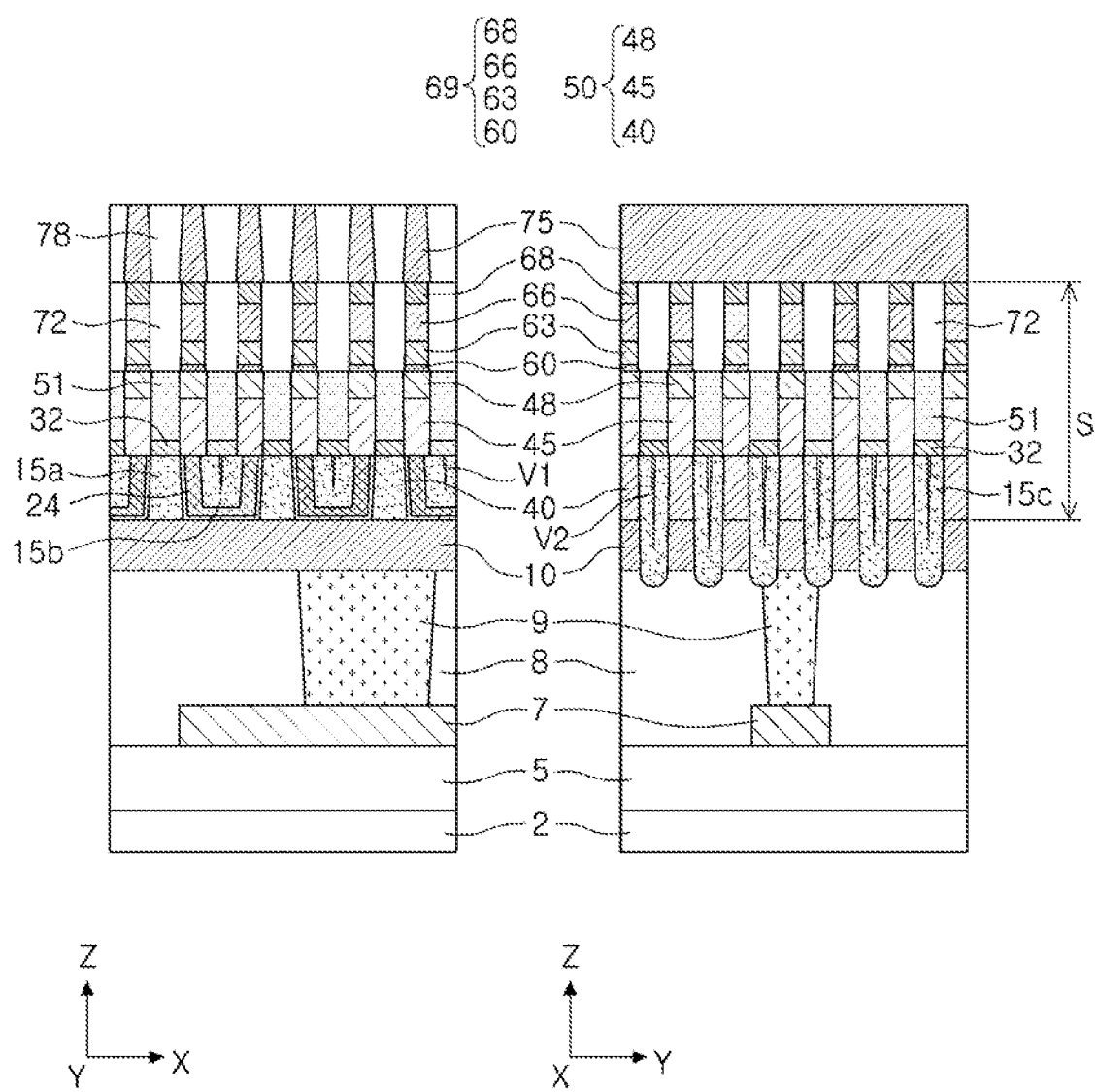
FIG. 2 includes cross-sectional diagrams illustrating a semiconductor device according to an exemplary embodiment of the present inventive concept.
Figure 3:
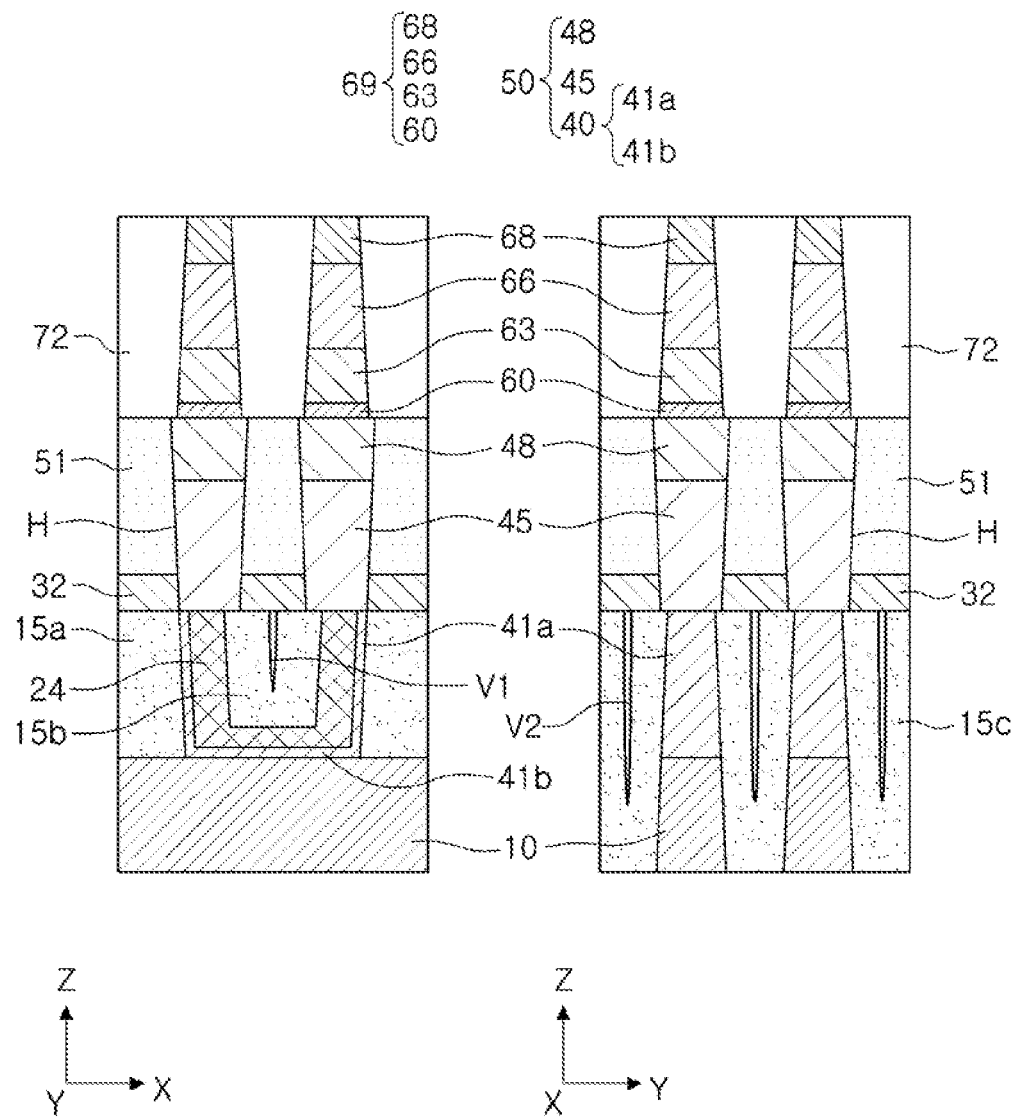
FIG. 3 includes cross-sectional diagrams illustrating partial regions illustrated in FIG. 2 in magnified form.

FIG. 1 is a diagram illustrating a semiconductor device according to an exemplary embodiment of the present inventive concept, viewed from the top. FIG. 2 includes cross-sectional diagrams illustrating a semiconductor device according to an exemplary embodiment of the present inventive concept, illustrating a cross-section taken along line I-I' illustrated in FIG. 1 and a cross-section taken along line II-II illustrated in FIG. 1. FIG. 3 includes cross-sectional diagrams illustrating partial regions illustrated in FIG. 2 in magnified form.

Referring to FIGS. 1 to 3, a semiconductor device according to an exemplary embodiment of the present inventive concept may include first conductive lines 10, second conductive lines 75, and a memory region S disposed between the first conductive lines 10 and the second conductive lines 75. The first conductive lines 10, the second conductive lines 75 and the memory region S are disposed on a substrate 2. The substrate 2 may be formed of a semiconductor material.

Peripheral circuits including a circuit wiring 7 and a contact plug 9 may be disposed between the substrate 2 and the first conductive lines 10. For ease of description, only one contact plug 9 is illustrated in each of the cross-sections of FIG. 2, but the contact plug 9 may be disposed below each of the first conductive lines 10. The peripheral circuits may include transistors disposed on the substrate 2. The transistors may be covered by a first base insulating layer 5. The circuit wiring 7 and the contact plug 9 may be surrounded by a second base insulating layer 8. The first base insulating layer 5 and the second base insulating layer 8 may be formed of an insulating material such as silicon oxide, or the like. The circuit wiring 7 and the contact plug 9 may be formed of a conductive material such as a metal (e.g., W, or the like), a metal nitride (e.g., TiN, WN, or the like) and/or a metal silicide (e.g., WSi, TSi, or the like), and the like.

The first conductive lines 10 may extend in a first direction (an X direction) parallel to an upper surface of the substrate 2 on the second base insulating layer 8, and the second conductive lines 75 may extend in a second direction (a Y direction) parallel to an upper surface of the substrate 2 and perpendicular to the first direction (the X direction). The first conductive lines 10 may be in parallel to each other and may be spaced apart from each other in the second direction (the Y direction). The second conductive lines 75 may be in parallel to each other and may be spaced apart from each other in the first direction (the X direction). The first and second conductive lines 10 and 75 may be formed of a conductive material such as a metal (e.g., W, or the like), a metal nitride (e.g., TiN, WN, or the like) and/or a metal silicide (e.g., WSi, TSi, or the like), and the like. The first conductive lines 10 may be word lines, and the second conductive lines 75 may be bit lines. Alternatively, the first conductive lines 10 may be bit lines, and the second conductive lines 75 may be word lines.

The memory region S may include data storage structures 50, selector structures 69, first insulating patterns 15a, second insulating patterns 15b, third insulating patterns 15c, spacer insulating patterns 24, an etch stop layer 32, a mold insulating layer 51, and a first interlayer insulating layer 72.

The data storage structures 50 may be connected to the respective selector structures 69 in series. The data storage structures 50 each may include a lower data storage electrode 40, a data storage pattern 45, and an upper data storage electrode 48.

The lower data storage electrodes 40 each may include a first portion 41a in contact with the data storage pattern 45, and a second portion 41b extending in the first direction (the X direction) from a lower portion of the first portion 41a and in contact with the first conductive line 10. The second portions 41b of a pair of the lower data storage electrodes 40 disposed on the first conductive line 10 and opposing each other may be connected to each other. Accordingly, a pair of the lower data storage electrodes 40 may be formed in a "U" shape. A pair of the lower data storage electrodes 40 forming a "U" shape may be repeatedly disposed on the first conductive line 10. The lower data storage electrodes 40 may be formed of a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON or TaON, or combinations thereof, and/or a carbon-based conductive material. The carbon-based conductive material may include C, CN, TiCN, or TaCN, or combinations thereof.

The first insulating patterns 15a may be alternately disposed with a pair of the lower data storage electrodes 40 forming a "U" shape on the first conductive line 10 in the first direction (the X direction). The spacer insulating patterns 24 may conformally cover internal side surfaces of the lower data storage electrodes 40 forming a "U" shape. The spacer insulating pattern 24 may have a "U" shape. The second insulating patterns 15b may be disposed on the spacer insulating patterns 24, and the spacer insulating patterns 24 may cover side surfaces and bottom surfaces of the second insulating patterns 15b. A first void V1 may be disposed in each of the second insulating patterns 15b. The first void V1 may be filled with a gas such as air, or the like. The first void V1 may extend up to the etch stop layer 32 from within the second insulating pattern 15b. The third insulating patterns 15c may be alternately disposed with the lower data storage electrode 40 in the second direction (the Y direction). The third insulating patterns 15c may extend in the first direction (the X direction). A second void V2 may be disposed in each of the third insulating patterns 15c. The second void V2 may extend in the first direction (the X direction), and may be filled with a gas such as air, or the like. The second void V2 may extend up to the etch stop layer 32 from within the third insulating pattern 15c. The lower data storage electrodes 40 may be disposed between the first insulating patterns 15a, and between the third insulating patterns 15c. The first insulating patterns 15a, the second insulating patterns 15b, the third insulating patterns 15c, and the spacer insulating patterns 24 may be formed of an insulating material such as $SiO_x$, $Si_xN_y$, SiON, SiCN, SiOCN, TiO, $ZrO_x$, $MgO_x$, $HfO_x$, $AlO_x$, and the like.

The etch stop layer 32 may cover the first insulating patterns 15a, the second insulating patterns 15b, and the third insulating patterns 15c, and an upper end of the first void V1 and an upper end of the second void V2 may be in contact with the etch stop layer 32. The first and second voids V1 and V2 may be referred to as first and second seams, respectively. The etch stop layer 32 may be formed of an insulating material different from insulating materials of the first insulating patterns 15a, the second insulating patterns 15b, and the third insulating patterns 15c. The etch stop layer 32 may be formed of an insulating material such as $SiO_x$, $Si_xN_y$, SiON, SiCN, SiOCN, TiO, $ZrO_x$, $MgO_x$, $HfO_x$, $AlO_x$, and the like.

The mold insulating layer 51 may be disposed on the etch stop layer 32. The data storage patterns 45 and the upper data storage electrodes 48 may be disposed in holes H penetrating the mold insulating layer 51 and the etch stop layer 32. Widths of the holes H may decrease towards a lower portion thereof. For example, widths of the holes H may decrease closer to the etch stop layer 32. For example, widths of the holes H may be 20 nm or less. The data storage patterns 45 may be disposed on the first portions 41a of the lower data storage electrode 40. The data storage patterns 45 may penetrate through the etch stop layer 32 and may be in contact with the first portions 41a of the lower data storage electrodes 40. The upper data storage electrodes 48 may be disposed on the data storage patterns 45. Lower surfaces of the upper data storage electrodes 48 may be in contact with upper surfaces of the data storage patterns 45.

The data storage pattern 45 may be configured such that a width of an upper portion thereof may be greater than a width of a lower portion thereof. Side surfaces of the data storage pattern 45 may be inclined with respect to an upper surface of the substrate 2. For example, the data storage pattern 45 may have a tapered shape. A width of a lower portion of the data storage pattern 45 may be greater than a width of an upper portion of the first portion 41a of the lower data storage electrode 40 in the second direction (the Y direction). The upper data storage electrode 48 may be configured such that a width of an upper portion thereof may be greater than a width of a lower portion thereof. Side surfaces of the upper data storage electrode 48 may be inclined with respect to an upper surface of the substrate 2. Side surfaces of the upper data storage electrode 48 may be coplanar with side surfaces of the data storage pattern 45. A width of a lower portion of the upper data storage electrode 48 may be the same as a width of an upper portion of the data storage pattern 45. For example, a width of an upper portion of the upper data storage electrode 48 may be 20 nm or less.

The data storage patterns 45 may be formed of a material capable of storing data using a change in resistance. For example, the data storage pattern 45 may be formed of a phase change memory material which may change a phase from a non-crystalline phase of high resistivity to a crystalline phase of low resistivity, or may change a phase from a crystalline phase to a non-crystalline phase, in accordance with a temperature and a time of heat caused by an applied current. A phase change memory material used as the data storage patterns 45 may include a chalcogenide material including Ge, Sb, and/or Te, or may be a material including at least one element between Te or Se, and at least one element among Ge, Sb, Bi, Pb, Sn, As, S, Si, P, O, N and In. A phase change memory material used as the data storage patterns 45 may be formed of a supper lattice material of GeTe—SbTe, an In—Sb—Te (IST) material, or a Bi—Sb—Te (BST) material.

The upper data storage electrode 48 may be formed of a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON, or TaON, or combinations thereof, and/or a carbon-based conductive material.

The selector structures 69 each may include a lower selector electrode 60, a selector pattern 63, an upper selector electrode 66, and a connection pattern 68 stacked in order in a third direction (a Z direction) perpendicular to an upper surface of the substrate 2. The lower selector electrode 60 may be in contact with the upper data storage electrode 48. The upper selector electrode 66 may be electrically connected to the second conductive line 75 through the connection pattern 68. In an exemplary embodiment of the present inventive concept, the connection patterns 68 may be omitted, and in this case, the upper selector electrode 66 may be in contact with the second conductive line 75. The connection patterns 68 may be formed of a conductive material.

A selector structure 69 may be configured such that a width of an upper portion thereof may be smaller than a width of a lower portion thereof. Side surfaces of the selector structure 69 may be inclined with respect to an upper surface of the substrate 2. Side surfaces of the lower selector electrode 60, side surfaces of the selector pattern 63, side surfaces of the upper selector electrode 66, and side surfaces of the connection pattern 68 may be coplanar with one another. A width of an upper portion of the upper data storage electrode 48 may be greater than a width of a lower portion of the selector structure 69, e.g., a width of the lower selector electrode 60, in the first direction (the X direction) and the second direction (the Y direction).

The selector patterns 63 may be formed of a threshold switching material. For example, the selector patterns 63 may be formed of an ovonic threshold switching material. The selector patterns 63 may be formed of a chalcogenide material different from the chalcogenide material used as the data storage patterns 45. For example, the selector patterns 63 may be formed of a chalcogenide-based ovonic threshold switching material which may maintain an amorphous phase when the semiconductor device operates.

The selector patterns 63 may include an alloy material including at least two or more elements among As, S, Se, Te and Ge, or may include an additional element (e.g., Si, N, and the like) which may maintain an amorphous phase at a higher temperature in addition to the alloy materials above. The selector patterns 63 may be formed of at least one alloy material among an alloy material including Te, As, Ge, and Si, an alloy material including Ge, Te, and Pb, an alloy material including Ge, Se, and Te, an alloy material including Al, As, and Te, an alloy material including Se, As, Ge, and Si, an alloy material including Se, As, Ge, and C, an alloy material including Se, Te, Ge, and Si, an alloy material including Ge, Sb, Te, and Se, an alloy material including Ge, Bi, Te, and Se, an alloy material including Ge, As, Sb, and Se, an alloy material including Ge, As, Bi, and Te, or an alloy material including Ge, As, Bi, and Se. The selector patterns 63 may be formed of a material including at least one of AsTeGeSiIn, GeTe, SnTe, GeSe, SnSe, AsTeGeSiSbS, AsTeGeSiP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, N treatmented OTS, TeAsGeSi, GeTePb, GeSeTe, AlAsTe, SeAsGeSi, SeAsGeC, SeTeGeSi, GeSbTeSe, GeBiTeSe, GeAsSbSe, GeAsBiTe, GeAsBiSe, AsSe, AsSeGe, AsSeGeTe, AsGeTeSi, or $Ge_xSe_{1-x}$.

The selector pattern 63 implemented as a threshold switching device may be switched from an off-state to an on-state when a voltage of a magnitude equal to or higher than a threshold voltage is applied.

The lower and upper selector electrodes 60 and 66 may be formed of a conductive material including TiN, TiAlN, TaN, WN, MoN, TiSiN, TiBN. ZrSiN, WSiN, WBN, ZrAlN, MoAlN, TaSiN, TaAlN, TiON, TiAlON, WON, or TaON, or combinations thereof, and/or a carbon-based conductive material.

The second conductive lines 75 may be in contact with the connection patterns 68. In an exemplary embodiment of the present inventive concept, in a case in which the connection patterns 68 are omitted, the second conductive lines 75 may be in contact with the upper selector electrode 66. For example, the second conductive lines 75 may directly contact the upper selector electrode 66. The first interlayer insulating layer 72 may be disposed around the selector structures 69. A second interlayer insulating layer 78 may be disposed between the second conductive lines 75. The second interlayer insulating layer 78 may be formed of an insulating material such as $SiO_x$, $Si_xN_y$, SiON, SiCN, SiOCN, TiO, $ZrO_x$, $MgO_x$, $HfO_x$, $AlO_x$, and the like.

FIGS. 4 to 8 are cross-sectional diagrams illustrating a semiconductor device according to an exemplary embodiment of the present inventive concept. FIGS. 4 to 8 are similar to FIG. 3. In the description below, mostly differences will be described.

Figure 4:
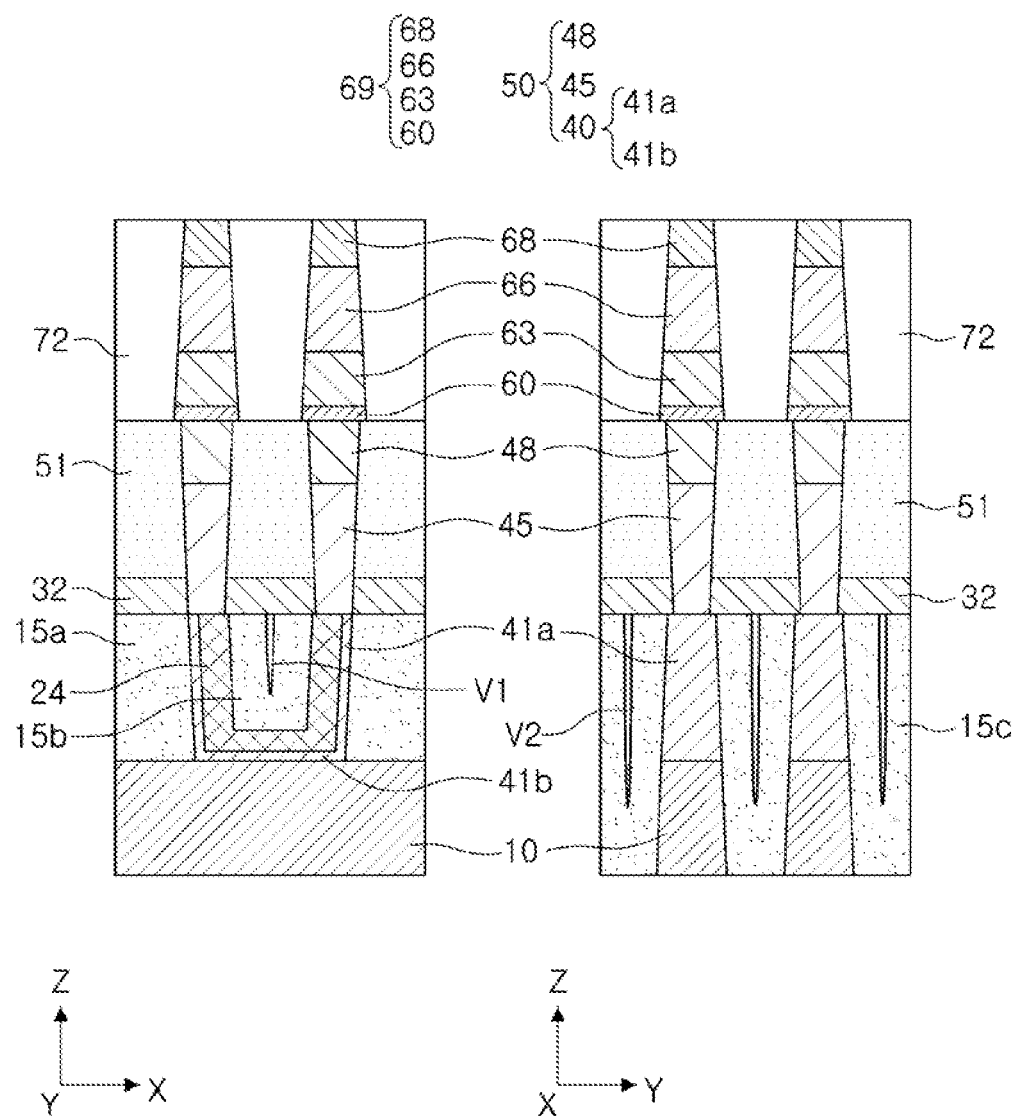
FIGS. 4, 5, 6, 7 and 8 are cross-sectional diagrams illustrating a semiconductor device according to an exemplary embodiment of the present inventive concept.

Referring to FIG. 4, widths of a data storage pattern 45 and an upper data storage electrode 48 may be smaller than the example illustrated in FIG. 3. A width of a lower portion of the data storage pattern 45 may be smaller than a width of an upper portion of a first portion 41a of the lower data storage electrode 40 in a second direction (the Y direction). In addition, the lower portion of the data storage pattern 45 may partially overlap the spacer insulating pattern 24 in the third direction (the Z direction). A width of an upper portion of the upper data storage electrode 48 may be smaller than a width of a lower portion of the selector structure 69, e.g., a width of the lower selector electrode 60.

Figure 5:
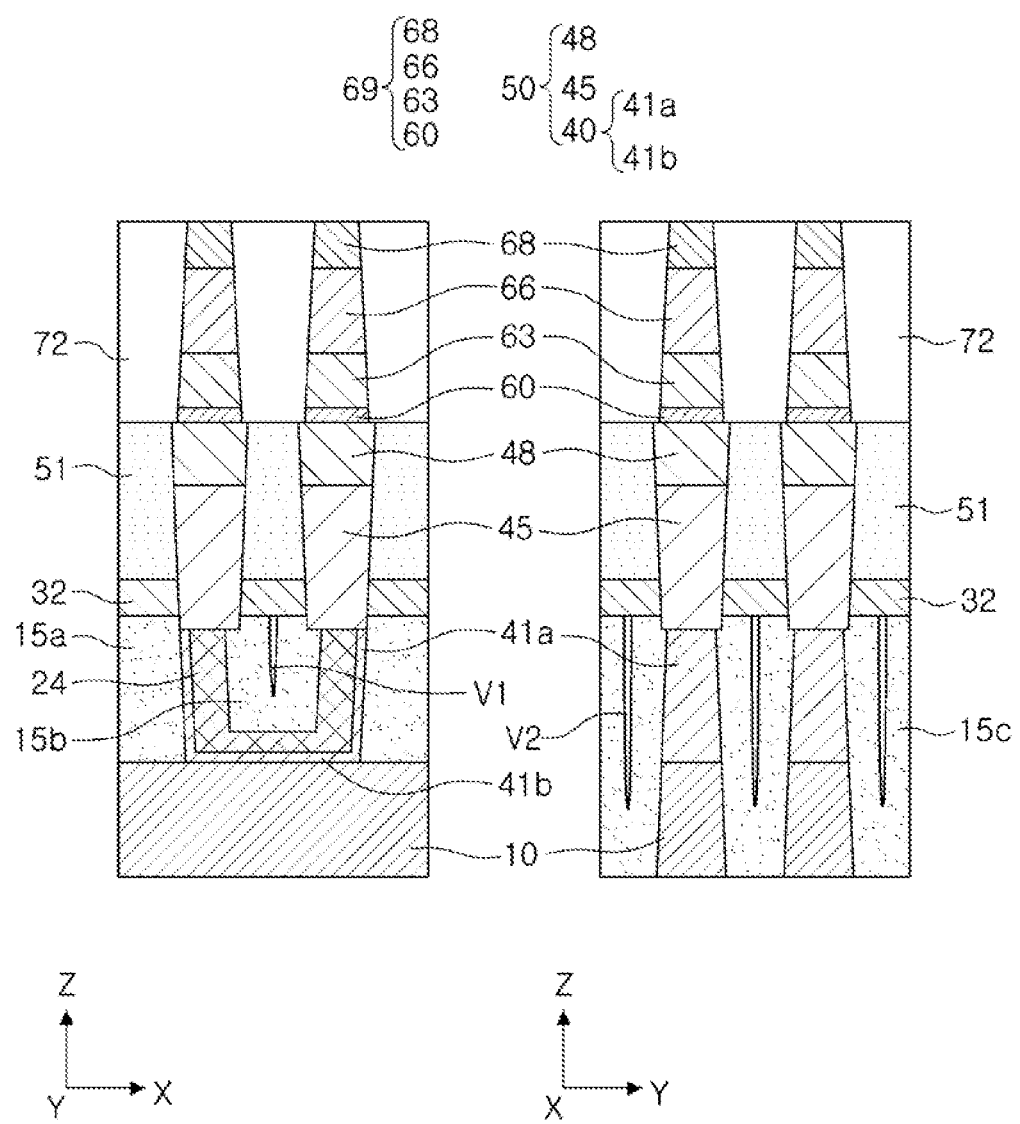

Referring to FIG. 5, differently from the example in FIG. 3, a lower surface of the data storage pattern 45 may be lower than a lower surface of an etch stop layer 32. Thus, the data storage pattern 45 may protrude below a lower surface of the etch stop layer 32 and into the first, second and third insulating patterns 15a, 15b and 15c.

Figure 6:
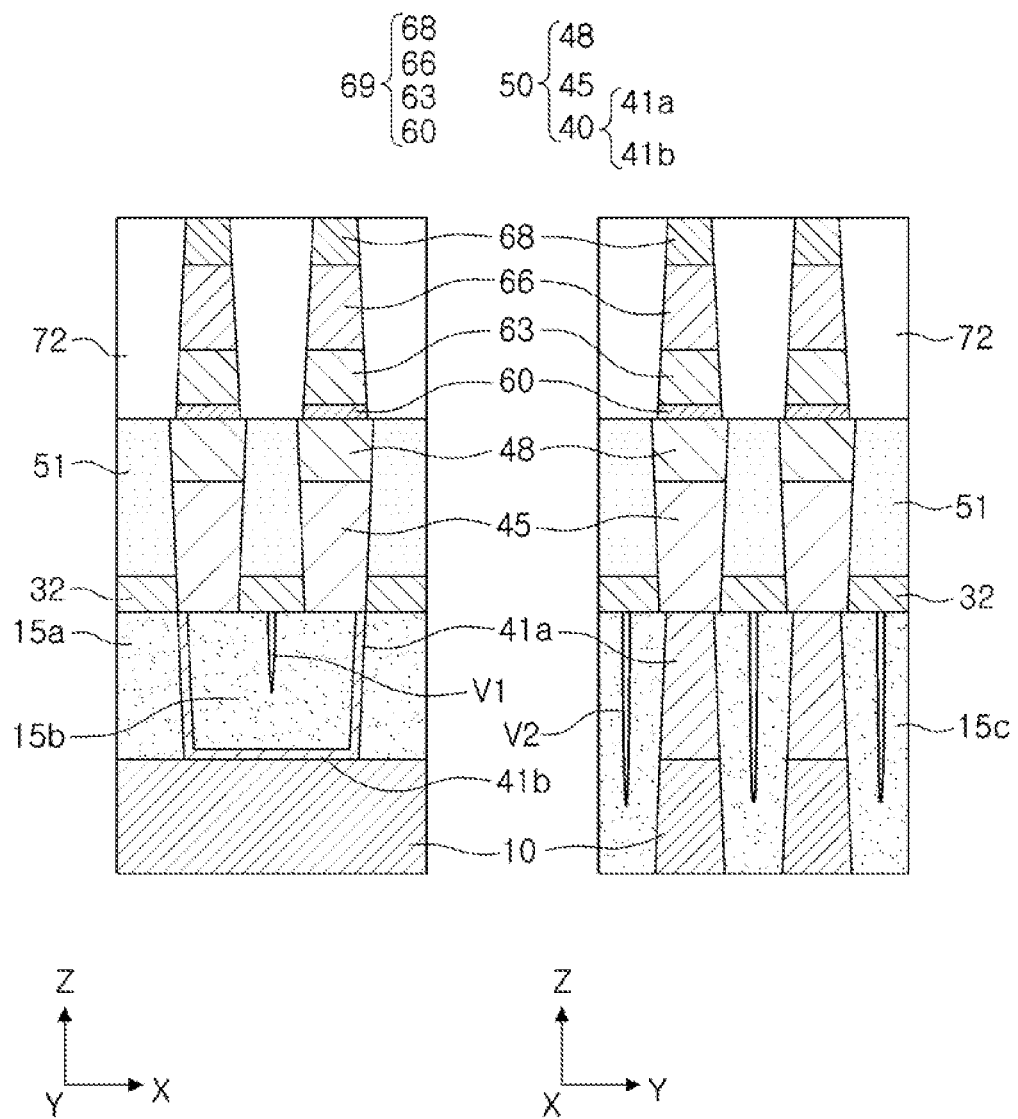

Referring to FIG. 6, differently from the example in FIG. 3, a spacer insulating pattern 24 may be omitted.

Figure 7:
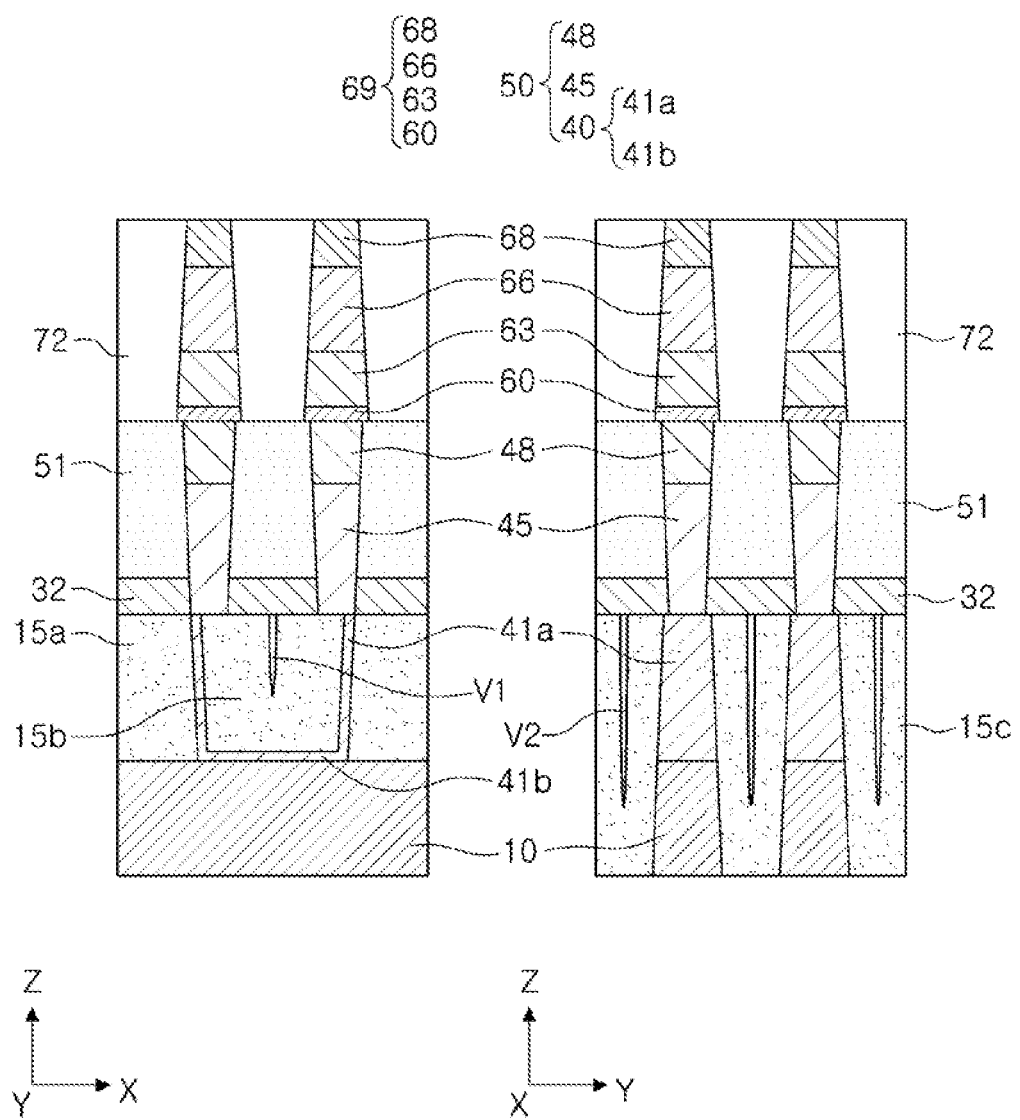

Referring to FIG. 7, widths of a data storage pattern 45 and an upper data storage electrode 48 may be smaller than the example illustrated in FIG. 3. A width of a lower portion of the data storage pattern 45 may be smaller than a width of an upper portion of a first portion 41a of the lower data storage electrode 40 in the second direction (the Y direction). A width of an upper portion of the upper data storage electrode 48 may be smaller than a width of a lower portion of a selector structure 69, e.g., a width of a lower selector electrode 60. A spacer insulating pattern 24 may also be omitted.

Figure 8:
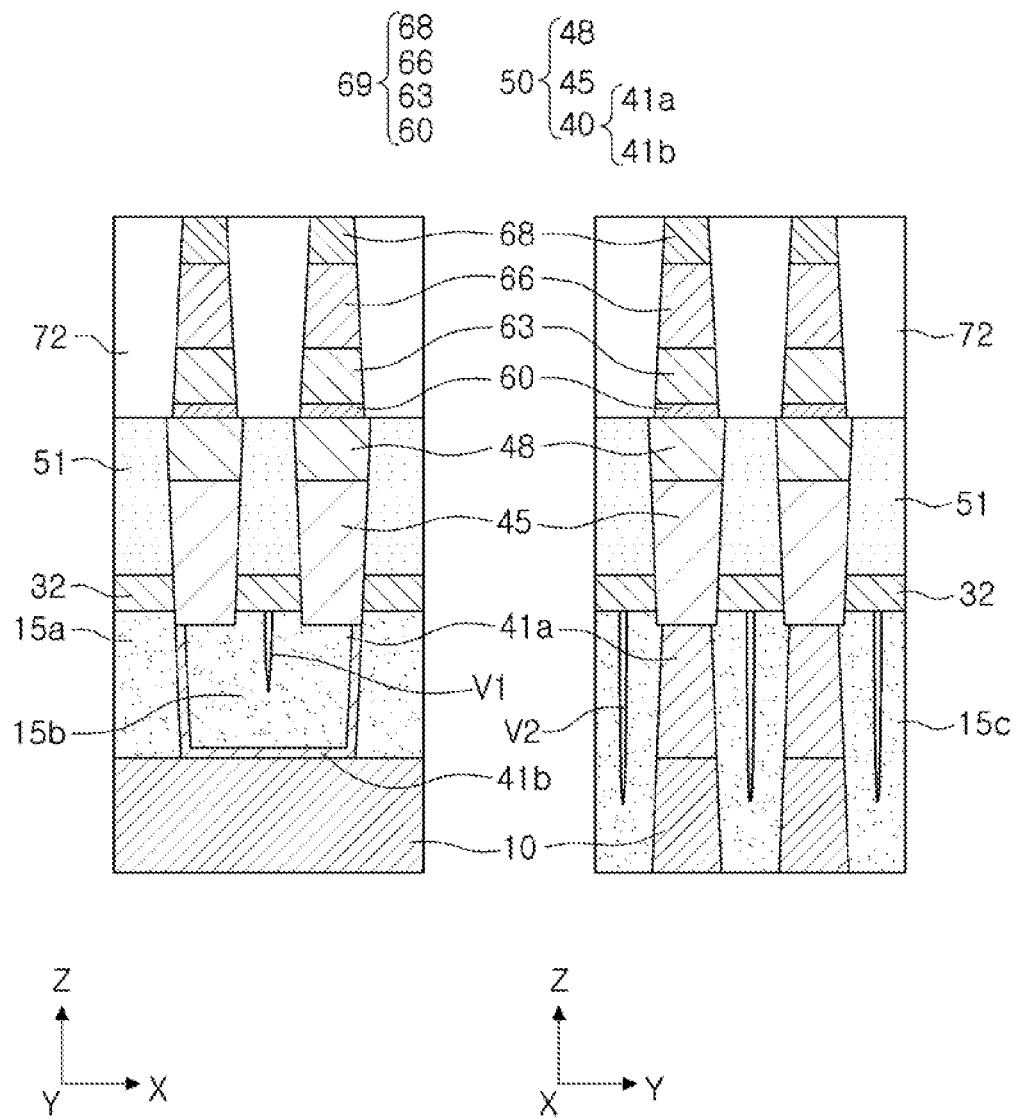

Referring to FIG. 8, differently from the example in FIG. 3, a lower surface of a data storage pattern 45 may be lower than a lower surface of an etch stop layer 32. Thus, the data storage pattern 45 may protrude further downward than a lower surface of the etch stop layer 32. A spacer insulating pattern 24 may also be omitted.

FIGS. 9 to 21 are diagrams illustrating a method of manufacturing a semiconductor device according to an exemplary embodiment of the present inventive concept. FIGS. 9, 11, 13, 15, 17, 19, 21, 23, 25, and 27 are diagrams illustrating a method of manufacturing a semiconductor device according to an exemplary embodiment of the present inventive concept, viewed from the top, and FIGS. 10, 12, 14, 16, 18, 20, 22, 24, 26, and 28 are cross-sectional diagrams illustrating a method of manufacturing a semiconductor device according to an exemplary embodiment of the present inventive concept.

Figure 9:
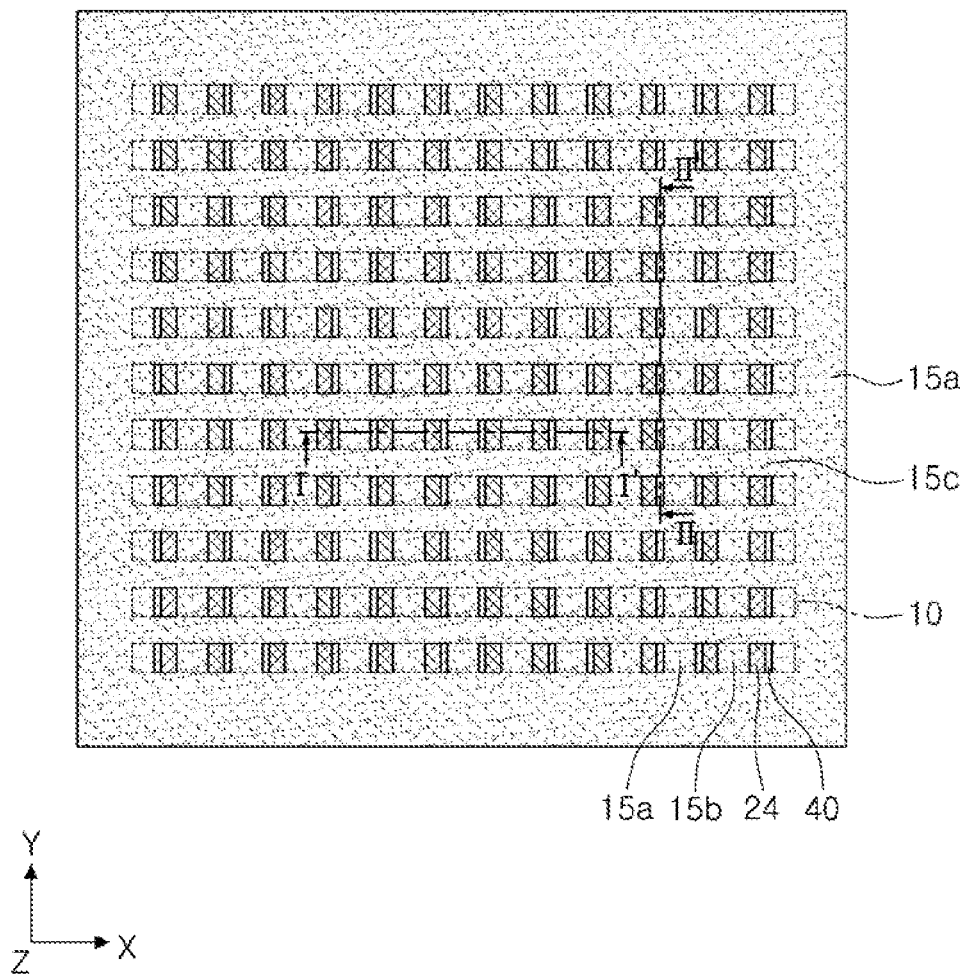
Figure 10:
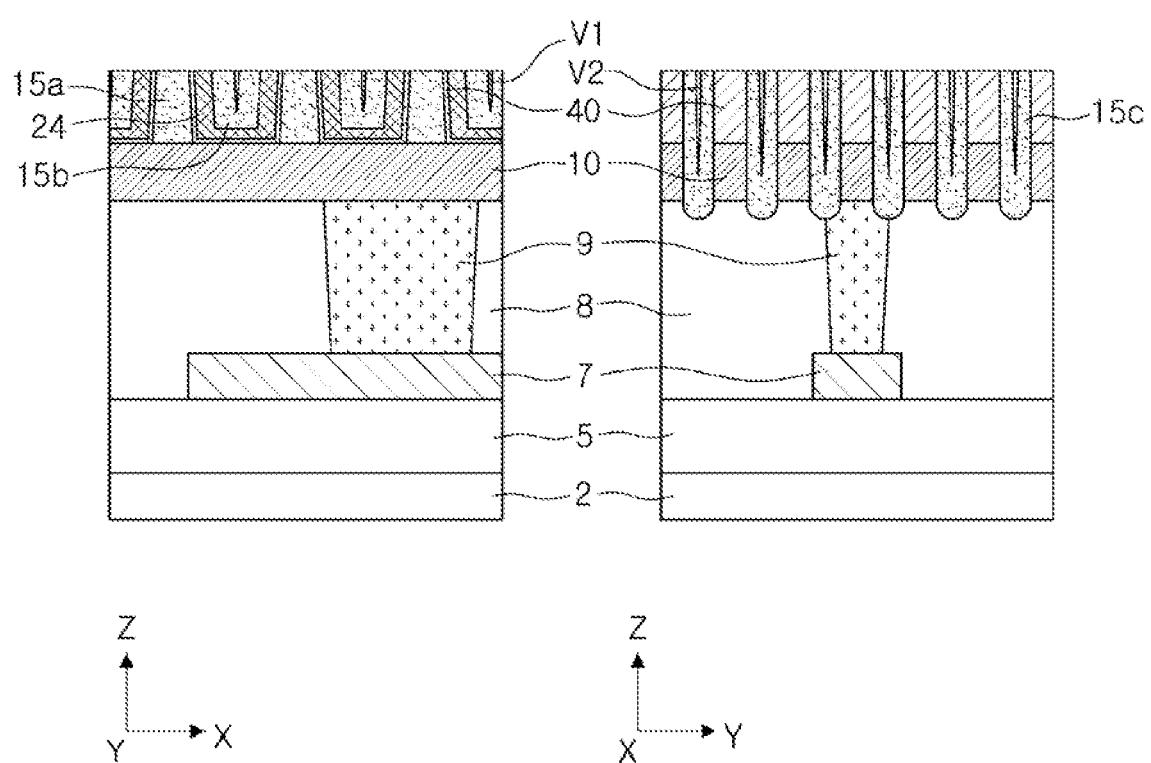

Referring to FIGS. 9 and 10, a first base insulating layer 5, a circuit wiring 7, a contact plug 9, and a second base insulating layer 8 may be formed on a substrate 2. Transistors may be formed on the substrate 2. The transistors may be covered by the first base insulating layer 5. The circuit wiring 7 and the contact plug 9 may be surrounded by the second base insulating layer 8.

First conductive lines 10 may be formed on the second base insulating layer 8, lower data storage electrodes 40, first insulating patterns 15a, spacer insulating patterns 24, and second insulating patterns 15b may be formed on the first conductive lines 10, and third insulating patterns 15c extending in a first direction (the X direction) may be formed between the first insulating patterns 15a and the lower data storage electrode 40. A first void V1 may be formed in each of the second insulating patterns 15b, and a second void V2 may be formed in each of the third insulating patterns 15c. The second void V2 may extend in the first direction (the X direction).

The lower data storage electrodes 40 may be formed of a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON or TaON, or combinations thereof, and/or a carbon-based conductive material.

The first insulating patterns 15a, the second insulating patterns 15b, the third insulating patterns 15c, and the spacer insulating patterns 24 may be formed of an insulating material such as $SiO_x$, $Si_xN_y$, SiON, SiCN, SiOCN, TiO, $ZrO_x$, $MgO_x$, $HfO_x$, $AlO_x$, and the like. The spacer insulating patterns 24 may be formed of a material different from materials of the first insulating patterns 15a, the second insulating patterns 15b, and the third insulating patterns 15c.

Figure 11:
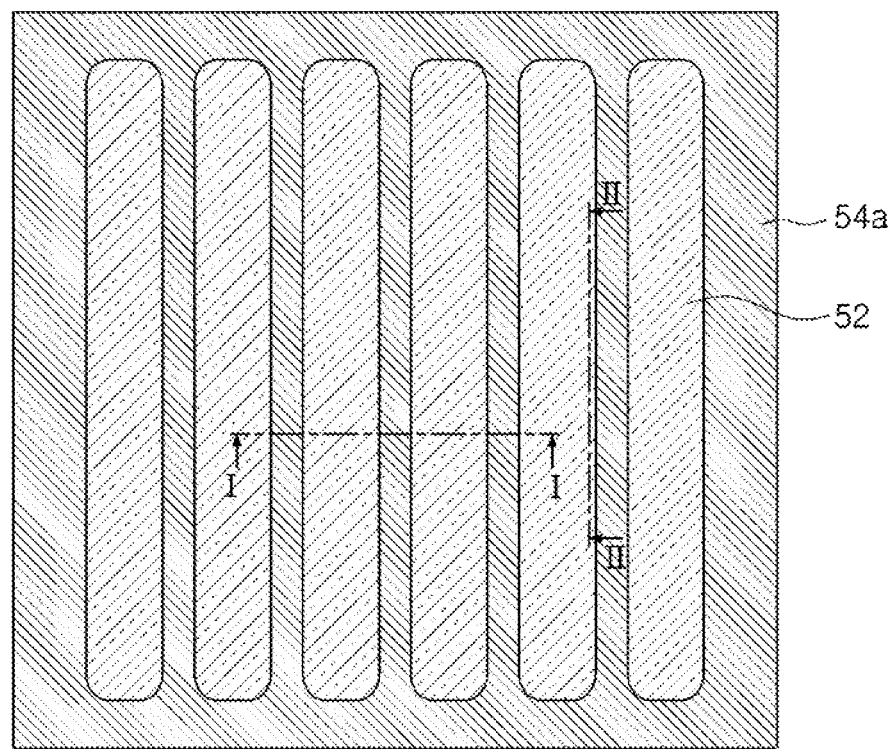
Figure 12:
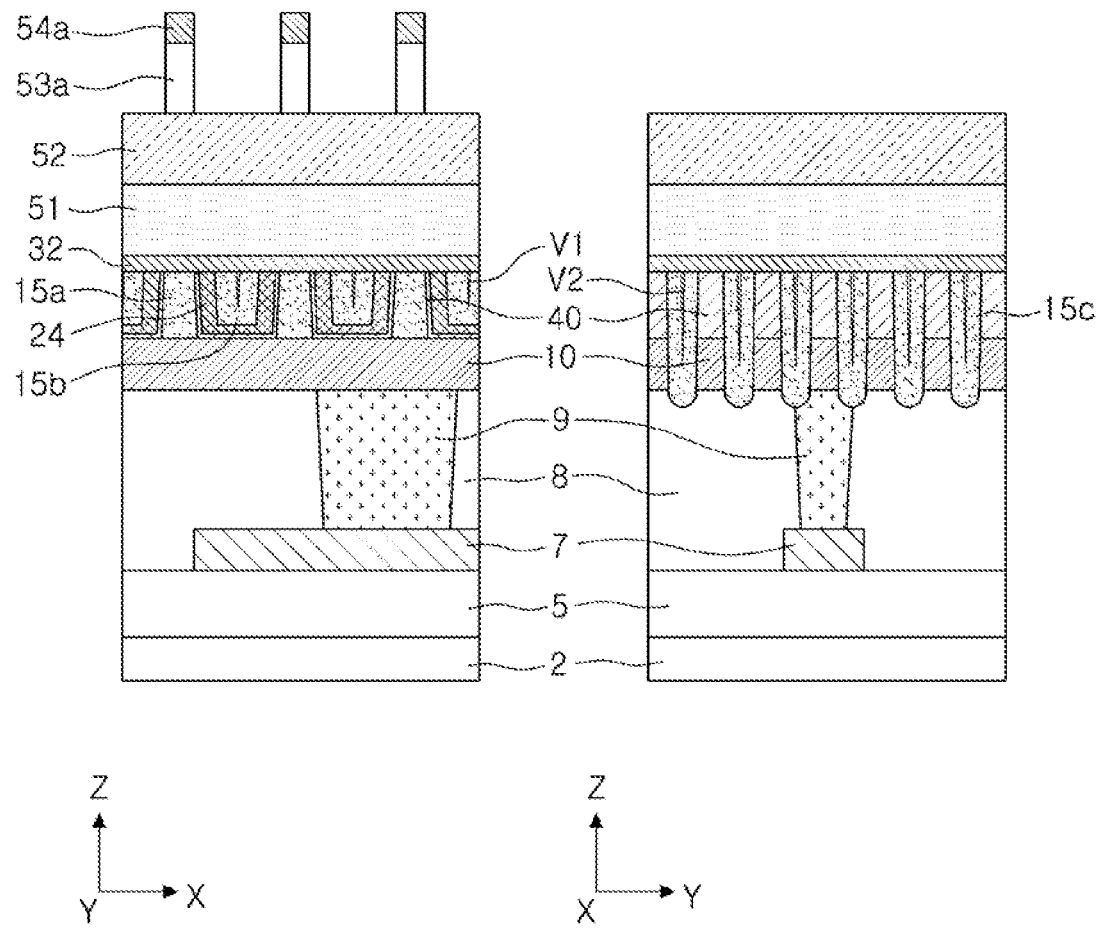

Referring to FIGS. 11 and 12, an etch stop layer 32, a mold insulating layer 51, a first hard mask layer 52, and second hard mask patterns 53a may be formed on the lower data storage electrode 40, the first insulating patterns 15a, the second insulating patterns 15b, the third insulating patterns 15c, and the spacer insulating patterns 24.

The second hard mask patterns 53a may be formed, after forming a second hard mask layer and a first anti-reflective layer on the first hard mask layer 52, by patterning the second hard mask layer using a photolithography process and an etching process. First anti-reflective patterns 54a may be formed on the second hard mask patterns 53a. The second hard mask patterns 53a may be spaced apart from each other in a first direction (the X direction) and may extend in a second direction (the Y direction).

The etch stop layer 32 and the mold insulating layer 51 may be formed of an insulating material such as $SiO_x$, $Si_xN_y$, SiON, SiCN, SiOCN, TiO, $ZrO_x$, $MgO_x$, $HfO_x$, $AlO_x$, and the like. The etch stop layer 32 may be formed of a material different from materials of the first insulating patterns 15a, the second insulating patterns 15b, the third insulating patterns 15c, the spacer insulating patterns 24, and the mold insulating layer 51. The first hard mask layer 52 may be formed of polycrystalline silicon, for example. The second hard mask patterns 53a may be formed of a spin on hardmask (SOH) material, for example. The first anti-reflective patterns 54a may be formed of SiON, for example.

Figure 13:
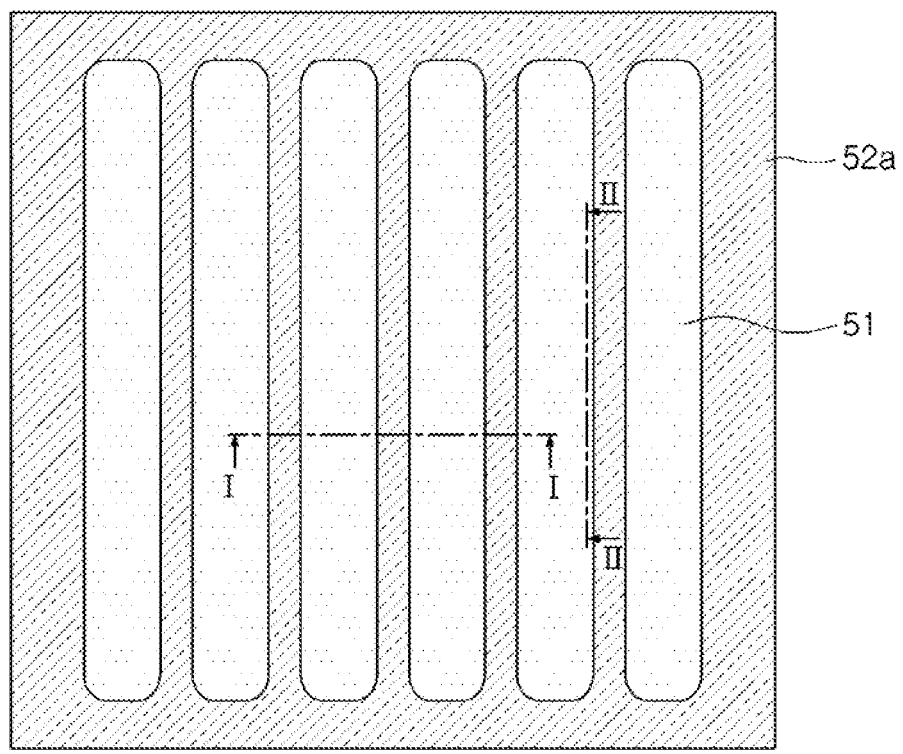
Figure 14:
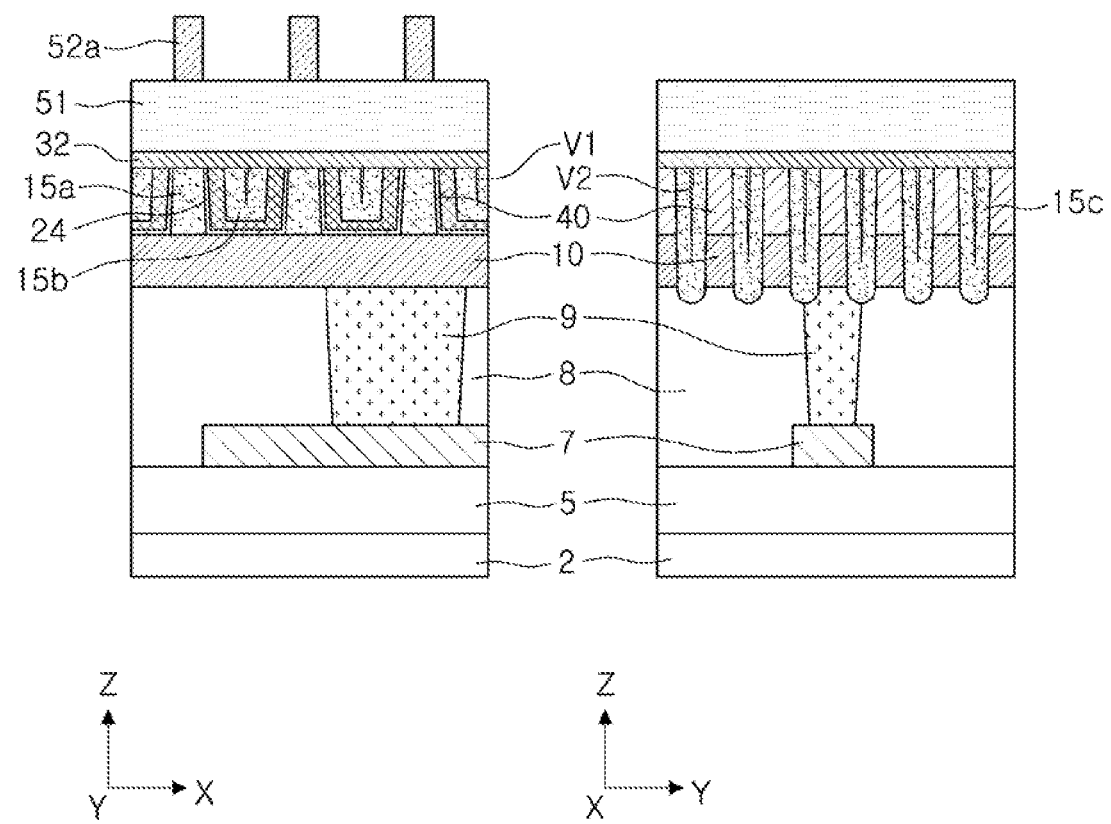

Referring to FIGS. 13 and 14, first hard mask patterns 52a may be formed on the mold insulating layer 51. The first hard mask patterns 52a may be formed by patterning the first hard mask layer 52 using the second hard mask pattern 53a as an etch mask. The first hard mask patterns 52a may be spaced apart from each other in a first direction (the X direction) and may extend in a second direction (the Y direction).

Figure 15:
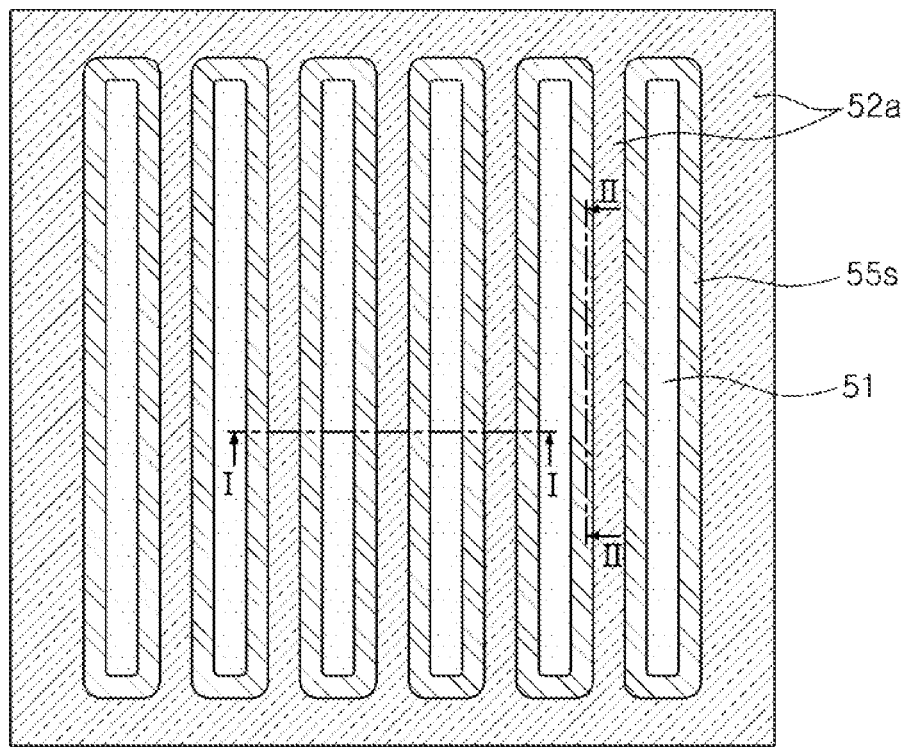
Figure 15:
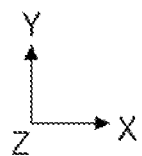
Figure 16:
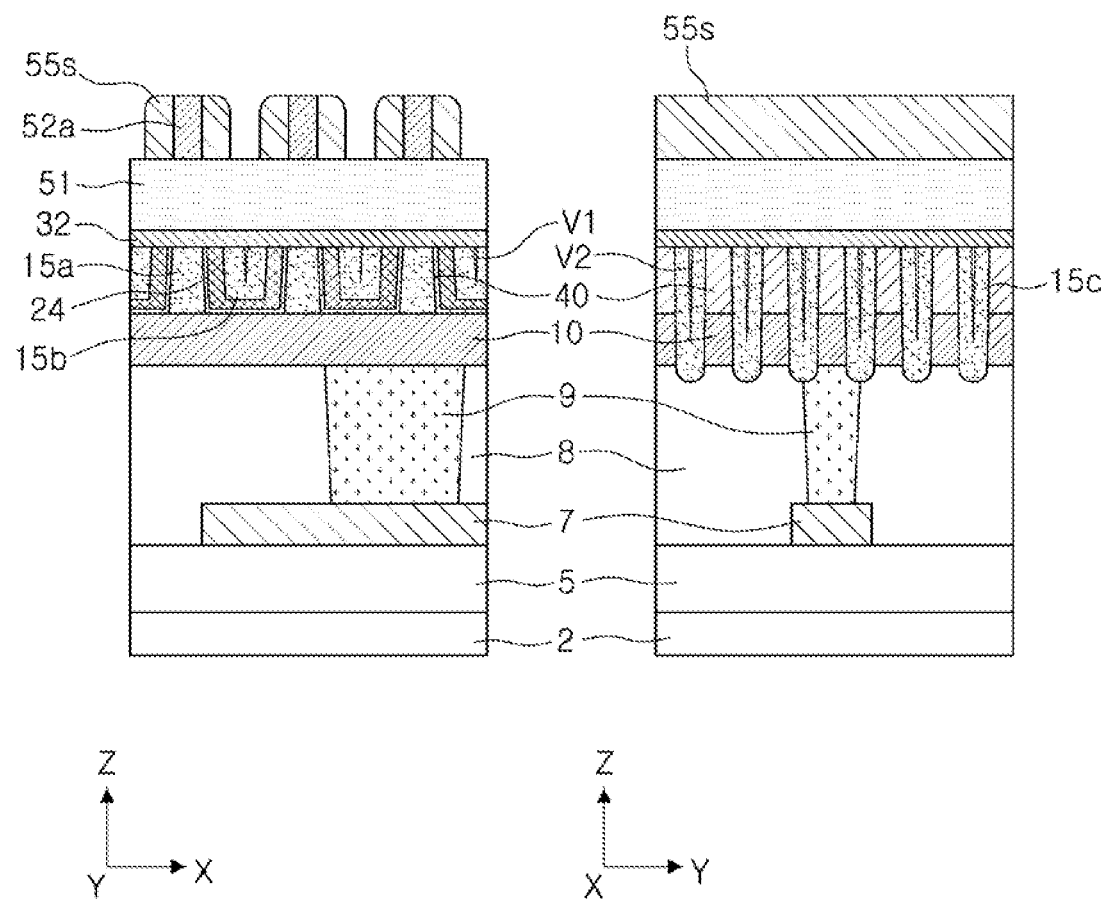

Referring to FIGS. 15 and 16, first spacers 55s may be formed on side surfaces of the first hard mask patterns 52a. The first spacers 55s may be formed of an insulating material such as $SiO_x$, $Si_xN_y$, SiON, SiCN, SiOCN, TiO, $ZrO_x$, $MgO_x$, $HfO_x$, $AlO_x$, and the like. The first spacers 55s may be formed of a material having etch selectivity in relation to the first hard mask patterns 52a. The first hard mask patterns 52a and the first spacers 55s may be formed of $SiO_x$, for example.

Figure 17:
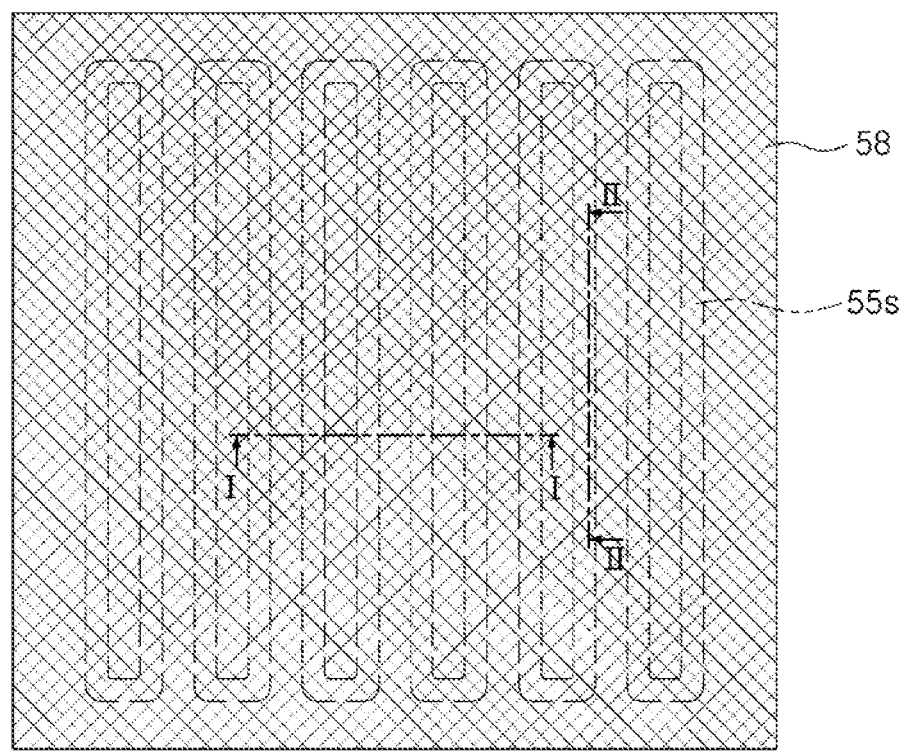
Figure 17:
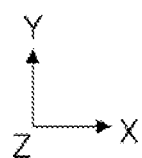
Figure 18:
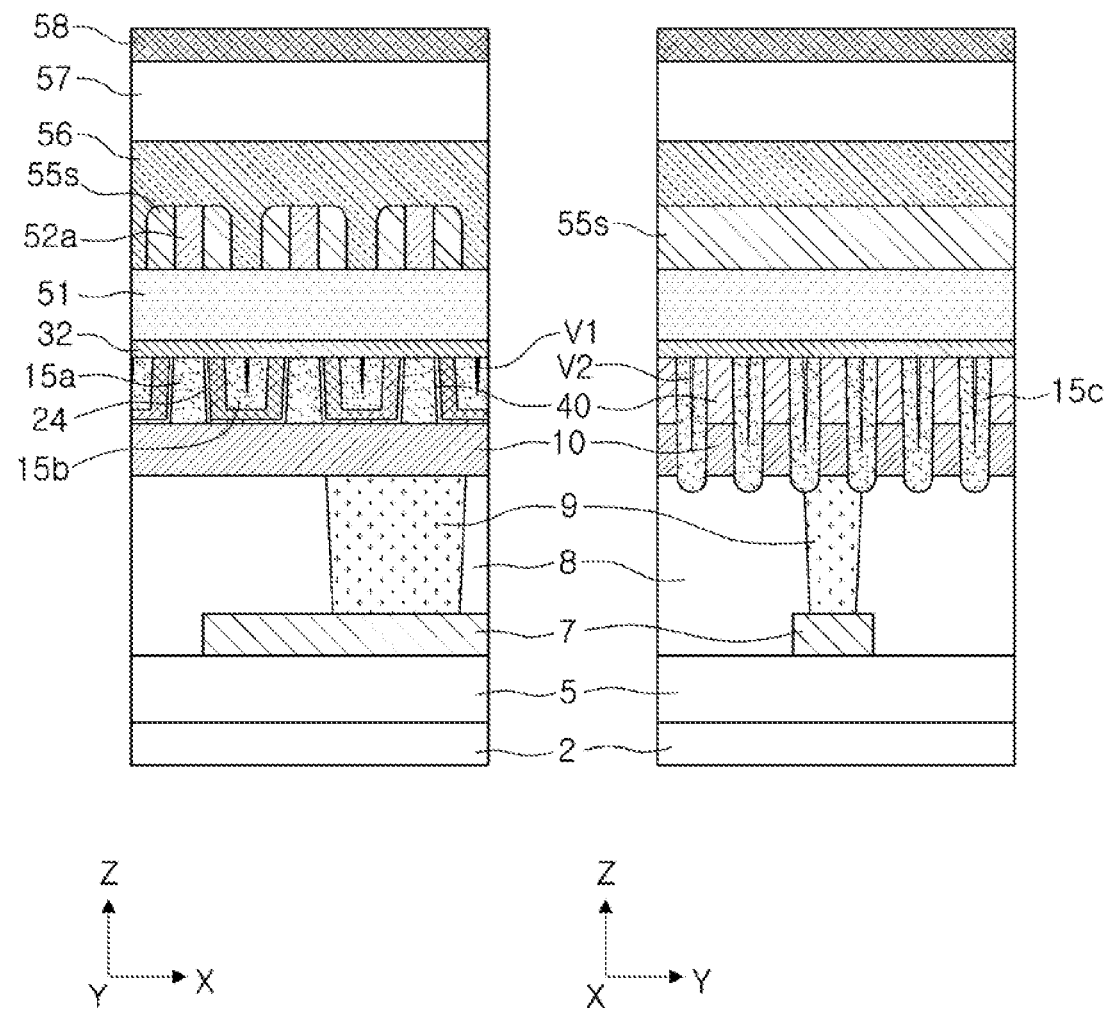

Referring to FIGS. 17 and 18, a third hard mask layer 56 and a fourth hard mask layer 57 covering first hard mask patterns 52a and first spacers 55s may be formed. A second anti-reflective layer 58 for a photolithography process may be formed on the fourth hard mask layer 57. The third hard mask layer 56 may fill a space between the first spacers 55s. The third hard mask layer 56 may be formed of a material the same as a material of the first hard mask patterns 52a. The fourth hard mask layer 57 may be formed of a spin on hardmask (SOH) material, for example. The second anti-reflective layer 58 may be formed of SiON, for example.

Figure 19:
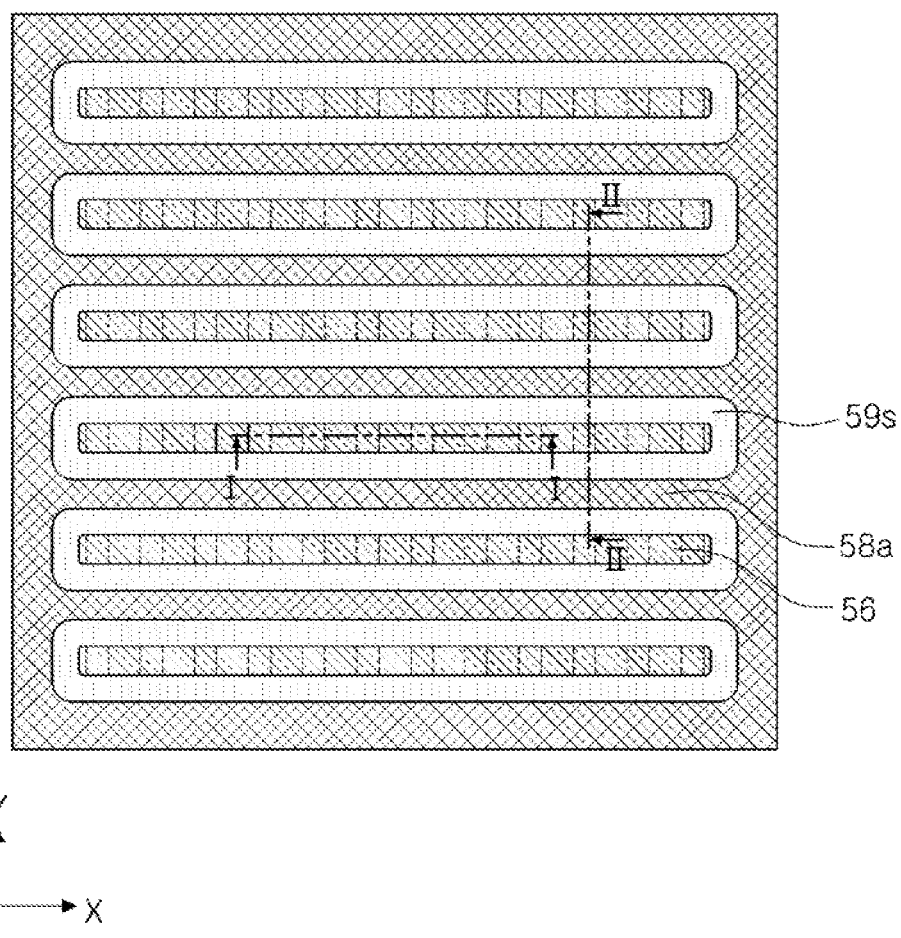
Figure 20:
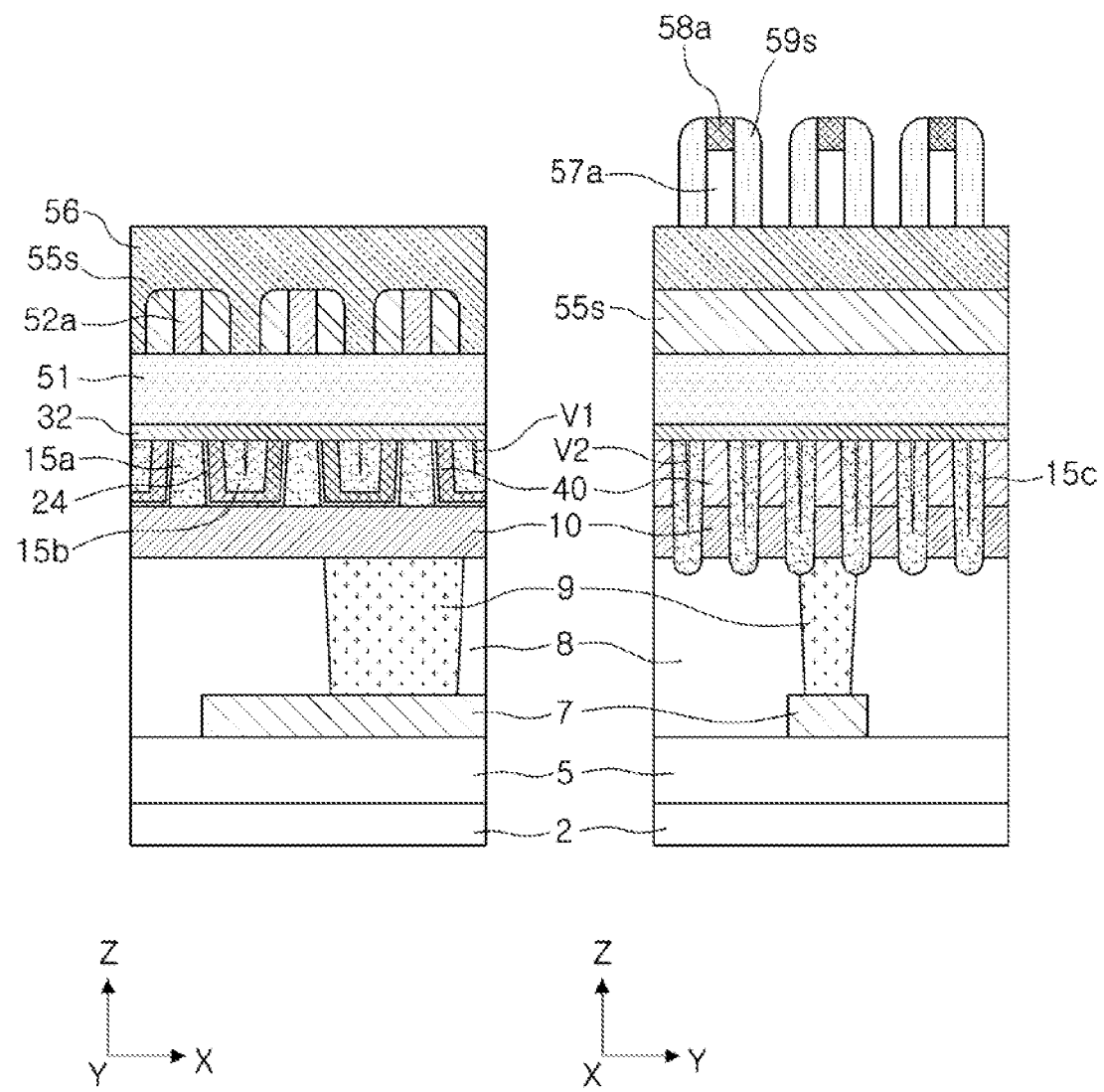

Referring to FIGS. 19 and 20, fourth hard mask patterns 57a may be formed on a third hard mask layer 56. Second anti-reflective patterns 58a may be formed on the fourth hard mask patterns 57a. For example, the second anti-reflective patterns 58a may directly contact the fourth hard mask patterns 57a.

The fourth hard mask patterns 57a may be formed by patterning the fourth hard mask layer 57 using a photolithography process and an etching process. The fourth hard mask patterns 57a may be spaced apart from each other in a second direction (the Y direction) and may extend in a first direction (the X direction).

Second spacers 59s may be formed on side surfaces of the fourth hard mask patterns 57a. The second spacers 59s may be spaced apart from each other in the second direction (the Y direction), and may extend in the first direction (the X direction). The second spacers 59s may be formed of an insulating material such as $SiO_x$, $Si_xN_y$, SiON, SiCN, SiOCN, TiO, $ZrO_x$, $MgO_x$, $HfO_x$, $AlO_x$, and the like. The second spacers 59s may be formed of a material having etch selectivity in relation to the fourth hard mask patterns 57a. The second spacers 59s may be formed of $SiO_x$, for example.

Figure 21:
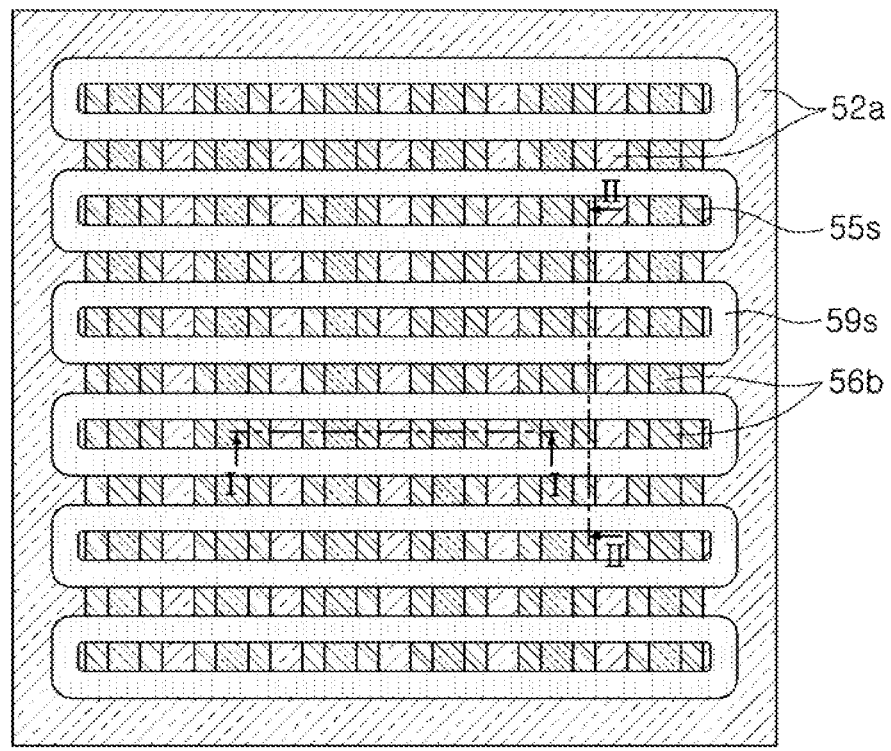
Figure 21:
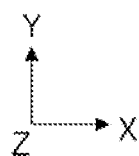
Figure 22:
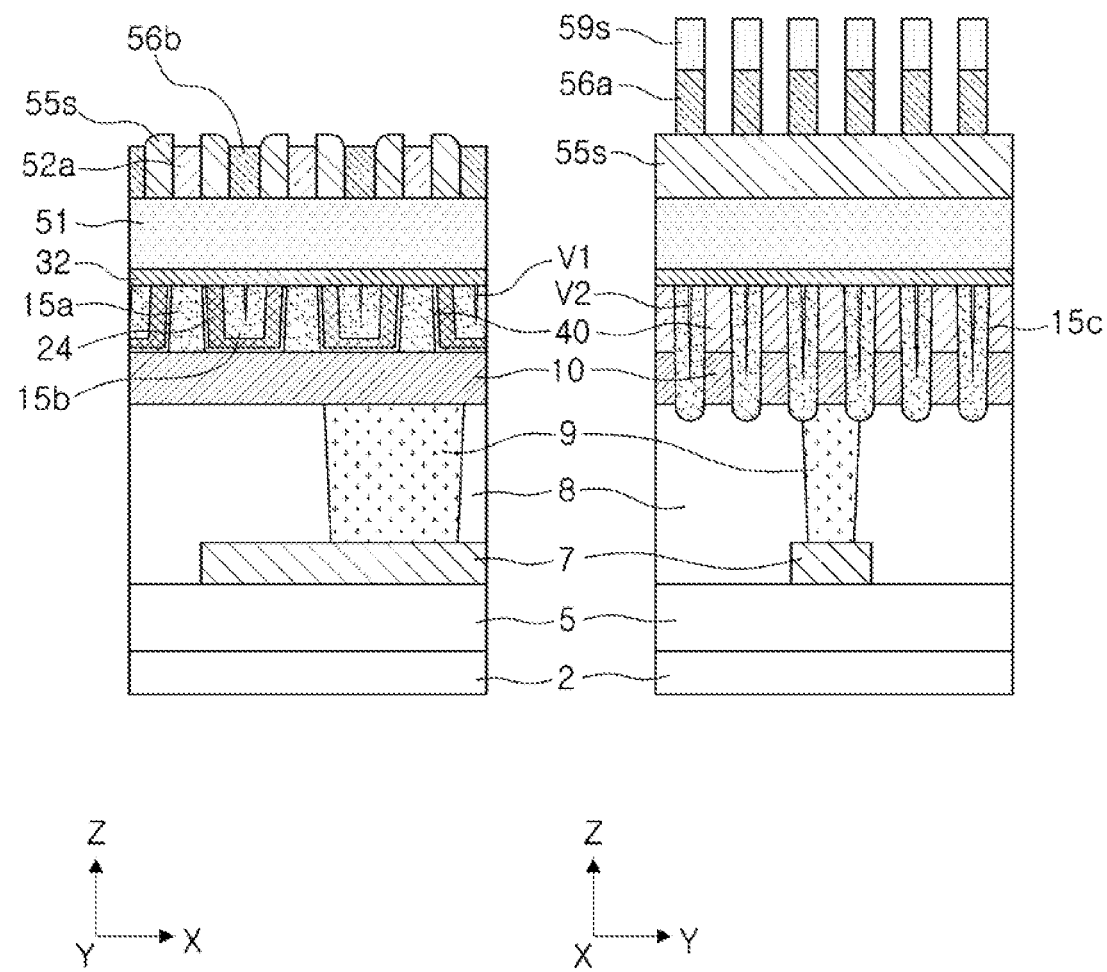

Referring to FIGS. 21 and 22, third hard mask patterns 56a may be formed on first spacers 55s, after removing the fourth hard mask patterns 57a and the second anti-reflective patterns 58a, by patterning the third hard mask layer 56 using second spacers 59s as etch masks. The second spacers 59s may remain on the third hard mask patterns 56a. The third hard mask patterns 56a may be spaced apart from each other in a second direction (the Y direction), and may extend in a first direction (the X direction). A portion of the third hard mask layer 56 may remain such that gap fill patterns 56b may be formed between the first spacers 55s.

Figure 23:
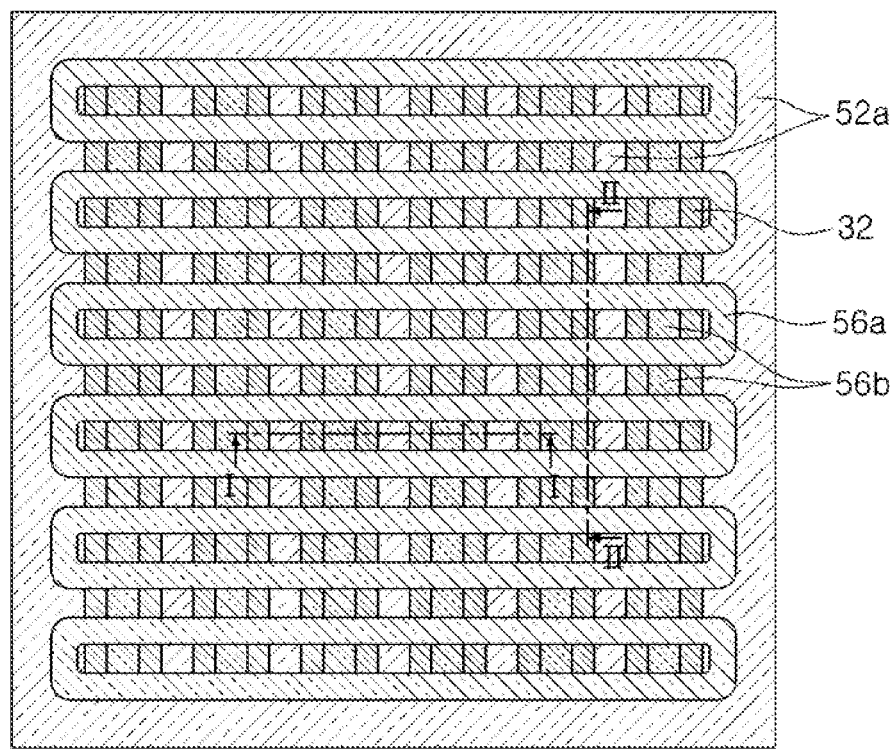
Figure 23:
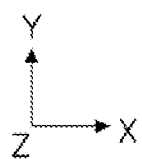
Figure 24:
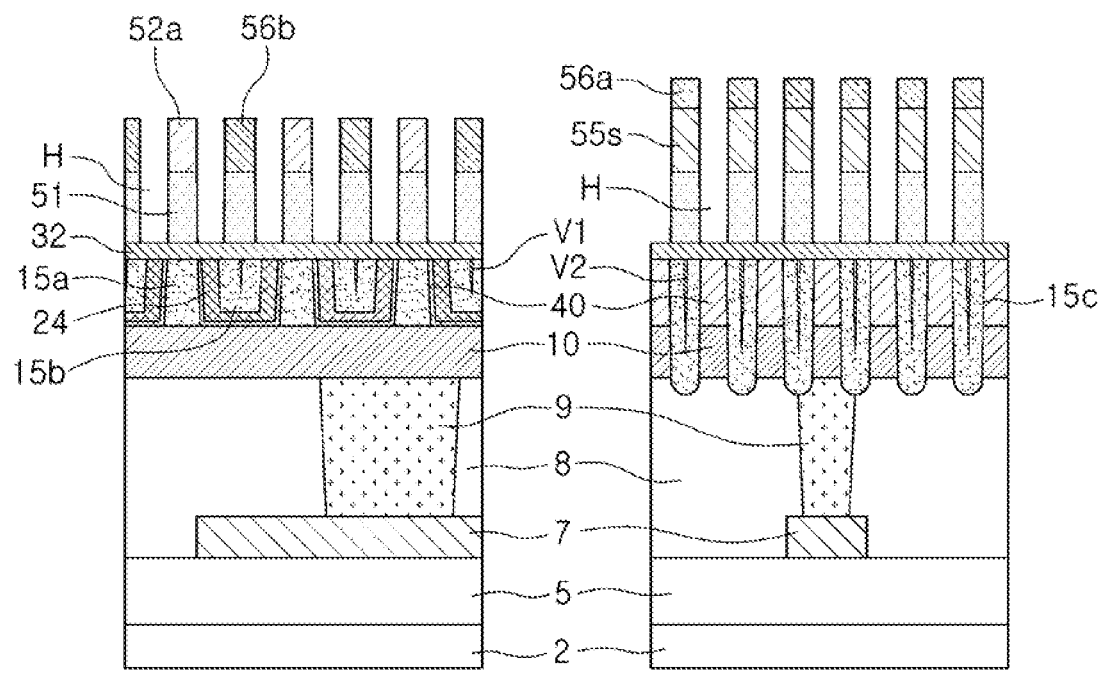

Referring to FIGS. 23 and 24, preliminary holes may be formed by etching the first spacers 55s using the third hard mask patterns 56a as etch masks. Side surfaces of the preliminary holes may be provided by the first hard mask patterns 52a, the gap fill patterns 56b, and the first spacers 55s. Holes H penetrating the mold insulating layer 51 may be formed by etching the mold insulating layer 51 exposed by the preliminary holes.

Figure 25:
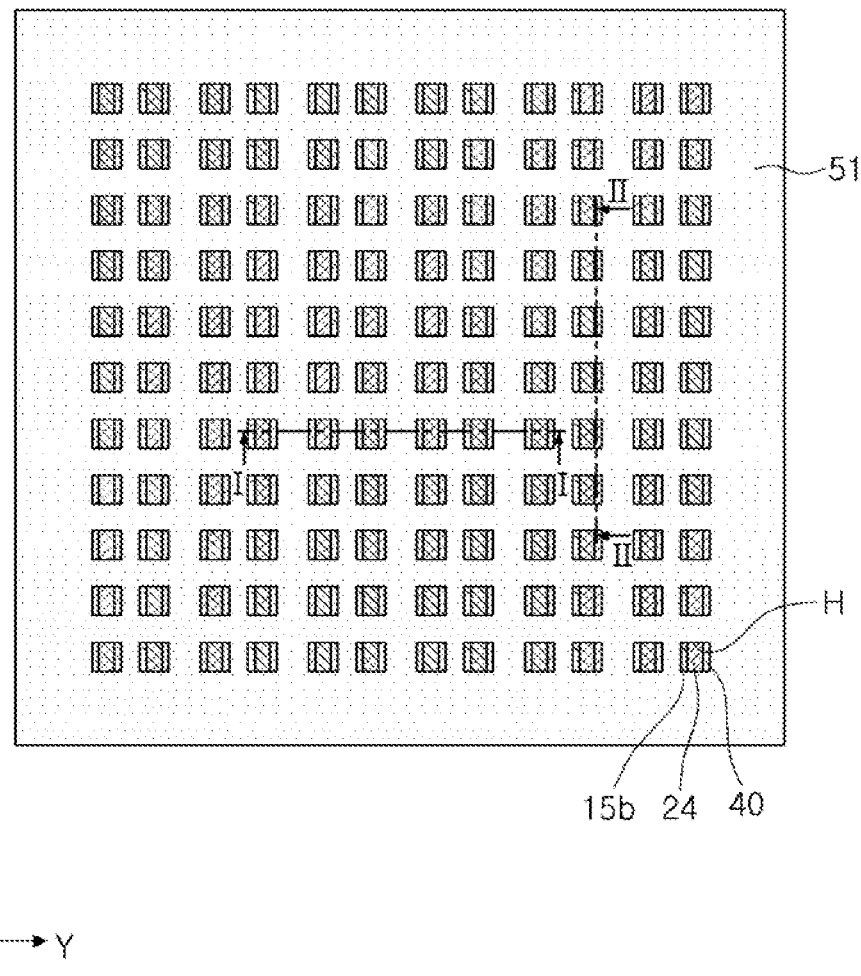
Figure 26:
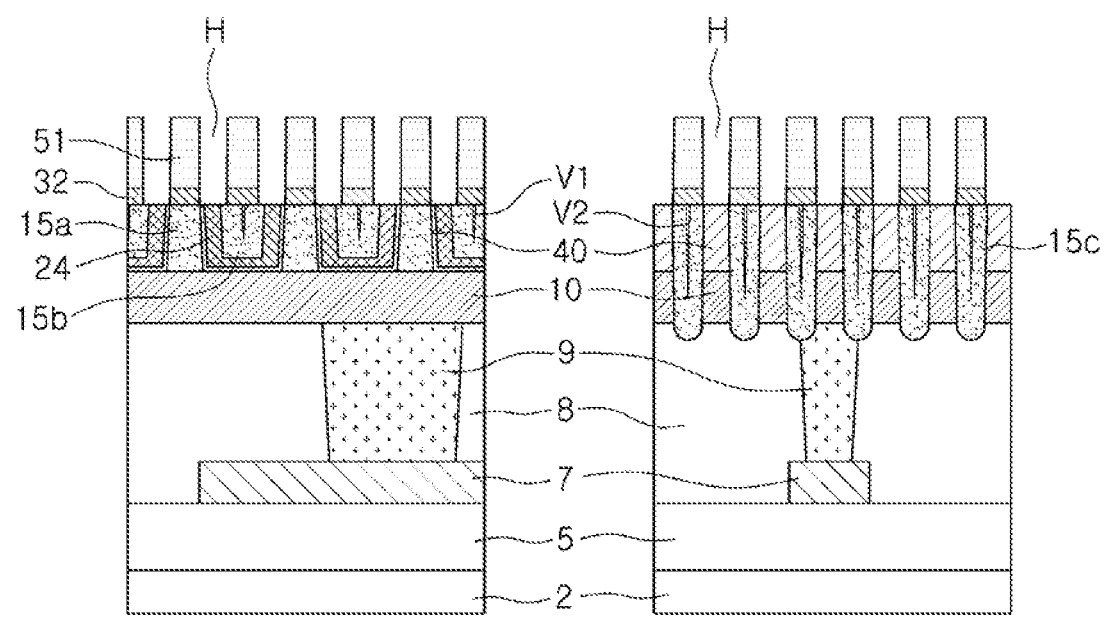

Referring to FIGS. 25 and 26, the lower data storage electrode 40 may be exposed by removing the third hard mask patterns 56a, the first hard mask patterns 52a, the gap fill patterns 56b, and the first spacers 55s remaining on the mold insulating layer 51, and etching the etch stop layer 32 exposed by the holes H penetrating the mold insulating layer 51.

Widths of the holes H taken in a first direction and a second direction may become narrow towards lower portions of the holes H from upper portions of the holes H. For example, widths of the holes H taken in the first direction and widths of the holes H taken in the second direction may be 20 nm or less. Side surfaces of the holes H may be inclined with respect to an upper surface of the substrate 2. Upper ends of the lower data storage electrodes 40, upper ends of the spacer insulating patterns 24, and portions of the second insulating patterns 15b may be exposed by the holes H.

Figure 27:
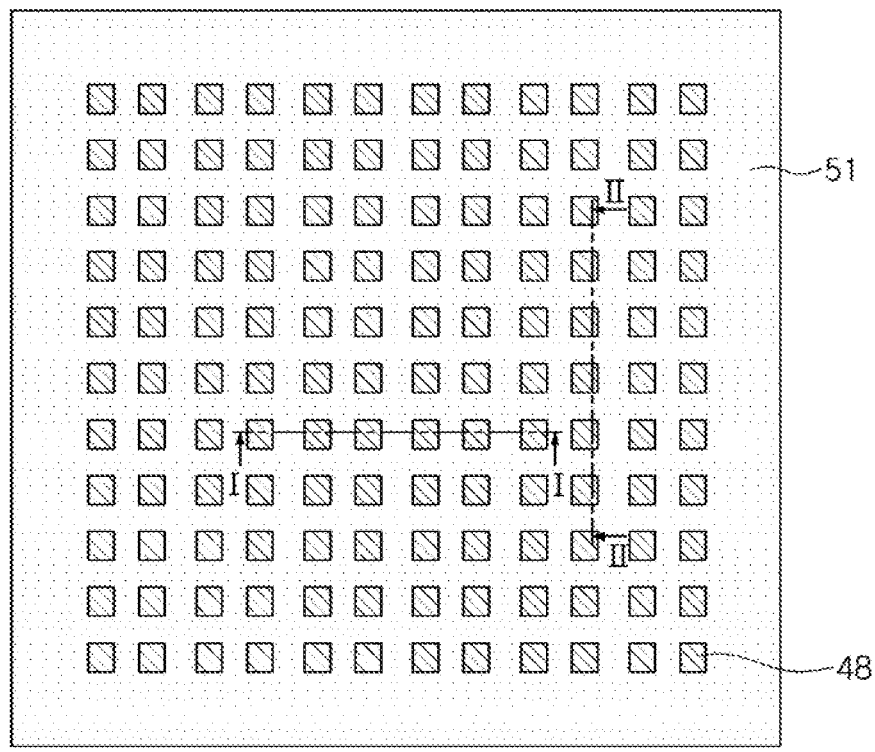
Figure 28:
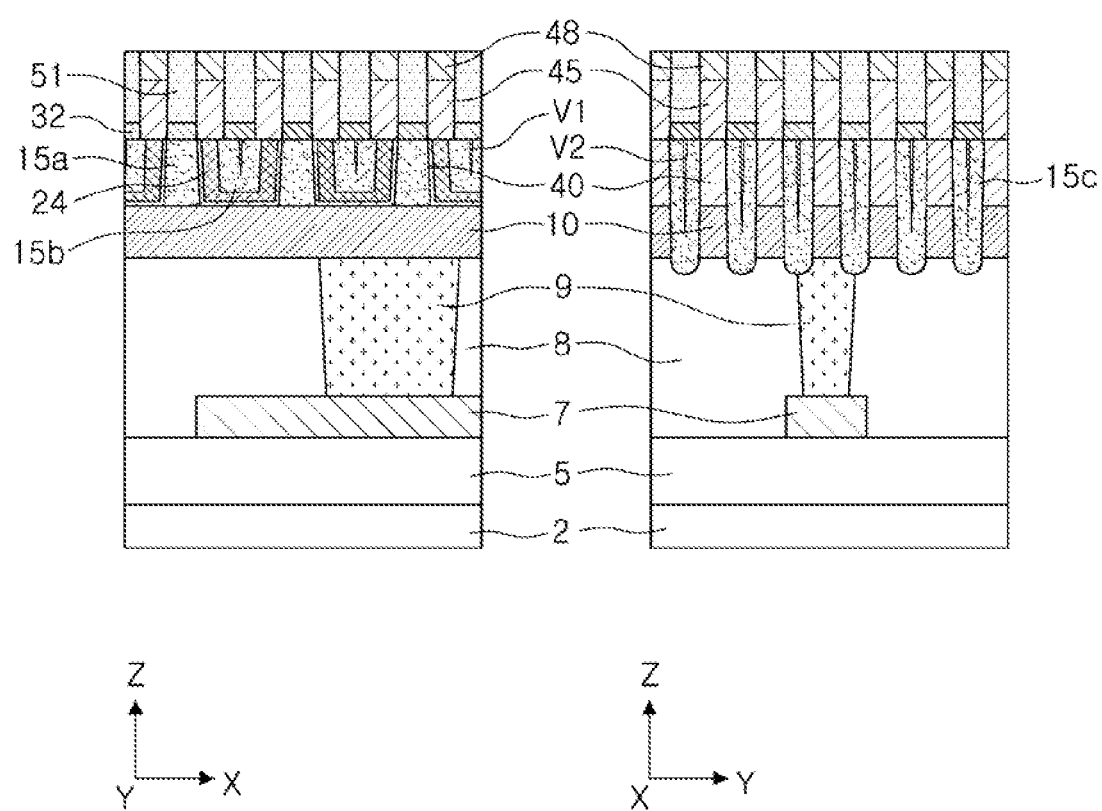

Referring to FIGS. 27 and 28, data storage patterns 45 and upper data storage electrodes 48 may be formed in the holes H.

The data storage patterns 45 may be formed, after forming a data storage material layer filling the holes H, by removing the data storage material layer from upper regions of the holes H by performing a planarization process and an etchback process. The upper data storage electrodes 48 may be formed, after forming the data storage material layer filling upper regions of the holes H, by performing a planarization process.

Referring back to FIG. 2, selector structures 69 may be formed on the upper data storage electrodes 48. A first interlayer insulating layer 72 filling peripheral regions of the selector structures 69 may be formed.

Second conductive lines 75 may be formed on the selector structures 69. A second interlayer insulating layer 78 filling peripheral regions of the second conductive lines 75 may be formed.

Figure 29:
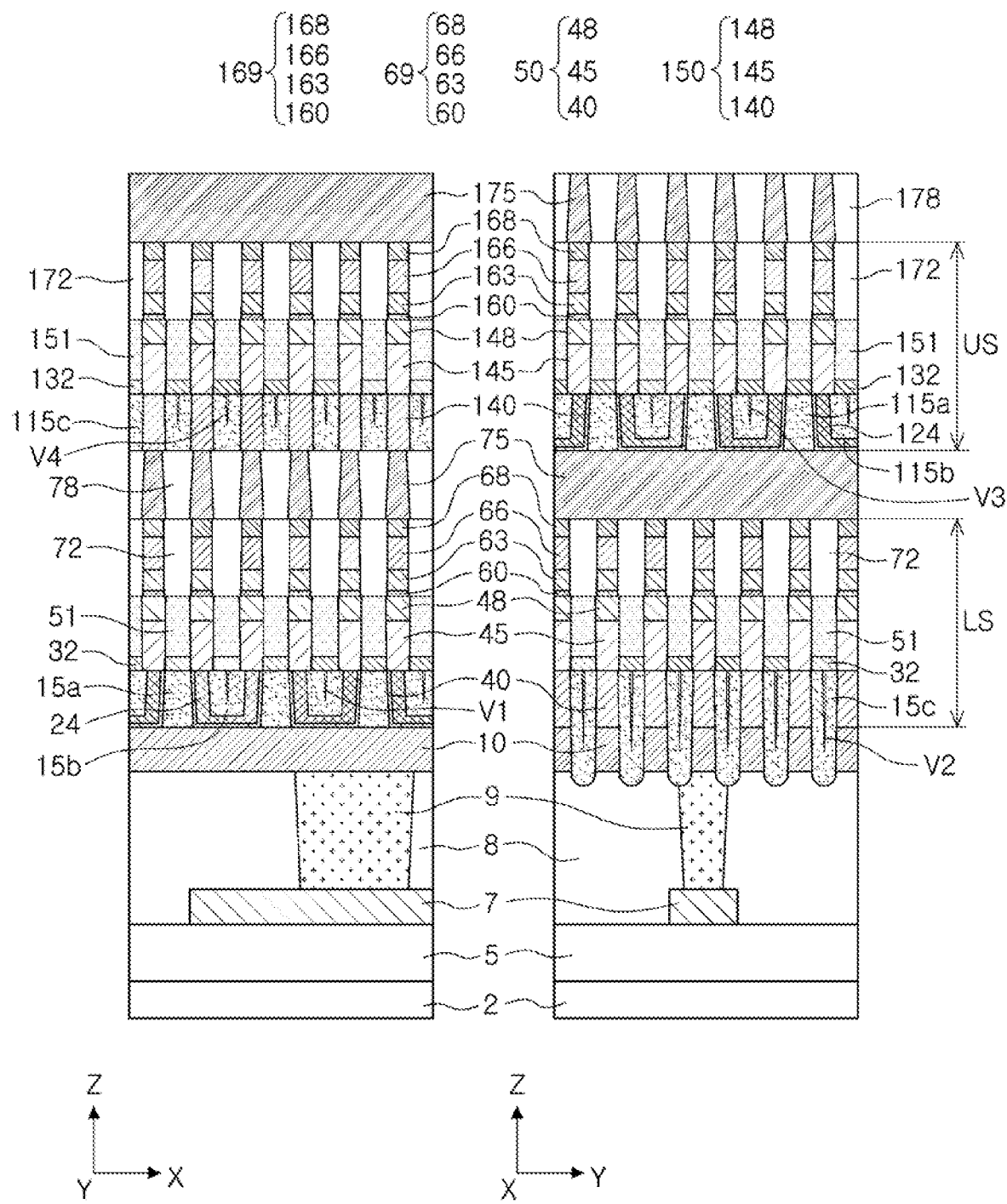
FIG. 29 includes cross-sectional diagrams illustrating a semiconductor device according to an exemplary embodiment of the present inventive concept.

FIG. 29 includes cross-sectional diagrams illustrating a semiconductor device according to an exemplary embodiment of the present inventive concept.

Referring to FIG. 29, first conductive lines 10 extending in a first direction (the X direction), second conductive lines 75 extending in a second direction (the Y direction), and third conductive lines 175 extending in the first direction (the X direction) may be disposed on a second base insulating layer 8 on a substrate 2. The first conductive lines 10 may be parallel to each other and may be spaced apart from each other. The second conductive lines 75 may be parallel to each other and may be spaced apart from each other. The third conductive lines 175 may overlap the first conductive lines 10 in a third direction (the Z direction).

A first memory region LS between the first conductive lines 10 and the second conductive lines 75 may include first data storage structures 50, first selector structures 69, first insulating patterns 15a, second insulating patterns 15b, third insulating patterns 15c, first spacer insulating patterns 24, a first etch stop layer 32, a first mold insulating layer 51, and a first interlayer insulating layer 72. The first data storage structures 50 may be connected to respective first selector structures 69 in series. A structure of the first memory region LS may be the same as a structure of a memory region S illustrated in FIG. 2. The first data storage structures 50 each may include a first lower data storage electrode 40, a first data storage pattern 45, and a first upper data storage electrode 48. The first selector structures 69 each may include a first lower selector electrode 60, a first selector pattern 63, a first upper selector electrode 66, and a first connection pattern 68. The first data storage structures 50 and the first selector structures 69 may be the same as the data storage structures 50 and the selector structures 69 described with reference to FIGS. 2 and 3.

A second memory region US between the second conductive lines 75 and the third conductive lines 175 may include second data storage structures 150, second selector structures 169, fourth insulating patterns 115a, fifth insulating patterns 115b, sixth insulating patterns 115c, second spacer insulating patterns 124, a second etch stop layer 132, a second mold insulating layer 151, and a third interlayer insulating layer 172.

The second data storage structures 150 may be connected to the respective second selector structures 169 in series.

The second data storage structures 150 may include a second lower data storage electrode 140, a second data storage pattern 145, and a second upper data storage electrode 148. The second lower data storage electrode 140, the second data storage pattern 145, and the second upper data storage electrode 148 may be arranged in sequence.

The second data storage structures 150 may be the same as the first data storage structure 50 rotated by 90 degrees in a direction horizontal to an upper surface of the substrate 2. Thus, the second data storage structure 150 may include the second lower data storage electrode 140 corresponding to the first lower data storage electrode 40, the second data storage pattern 145 corresponding to the first data storage pattern 45, and the second upper data storage electrode 148 corresponding to the first upper data storage electrode 48.

The second lower data storage electrode 140 may include a first portion in contact with the second data storage pattern 145 and a second portion extending in a second direction (the Y direction) from a lower portion of the first portion and in contact with the second conductive lines 75. The second portions of a pair of the second lower data storage electrodes 140 disposed on the second conductive lines 75 and opposing each other may be connected to each other. Thus, a pair of the second lower data storage electrodes 140 may be formed in a "U" shape. A pair of the second lower data storage electrodes 140 forming a "U" shape may be repeatedly disposed on the second conductive lines 75.

The fourth insulating patterns 115a may be alternately disposed with a pair of the second lower data storage electrodes 140 forming a "U" shape on the second conductive lines 75 in the second direction (the Y direction). The second spacer insulating patterns 124 may conformally cover internal side surfaces of the second lower data storage electrode 140 forming a "U" shape. The second spacer insulating patterns 124 may have a "U" shape. The fifth insulating patterns 115b may be disposed on the second spacer insulating patterns 124, and the second spacer insulating patterns 124 may cover side surfaces and bottom surfaces of the fifth insulating patterns 115b. A third void V3 may be disposed in each of the fifth insulating patterns 115b. The sixth insulating patterns 115c may be alternately disposed with the second lower data storage electrodes 140 in the first direction (the X direction). The sixth insulating patterns 115c may extend in the second direction (the Y direction). A fourth void V4 may be disposed in each of the sixth insulating patterns 115c. The fourth void V4 may extend in the second direction (the Y direction). The third void V3 and the fourth void V4 may be arranged along a row in the first direction (the X direction), for example. The second lower data storage electrodes 140 may be disposed between the fourth insulating patterns 115a and between the sixth insulating patterns 115c.

The second etch stop layer 132 may cover the fourth insulating patterns 115a, the fifth insulating patterns 115b, and the sixth insulating patterns 115c, and an upper end of the third void V3 and an upper end of the fourth void V4 may be in contact with the second etch stop layer 132.

The second mold insulating layer 151 may be disposed on the second etch stop layer 132. The second data storage patterns 145 may penetrate through the second etch stop layer 132 and may be in contact with the second lower data storage electrodes 140. For example, the second data storage patterns 145 may directly contact the second lower data storage electrodes 140 through an opening in the second etch stop layer 132. The second upper data storage electrodes 148 may be disposed on the second data storage patterns 145. Lower surfaces of the second upper data storage electrodes 148 may be in contact with upper surfaces of the second data storage patterns 145.

The second data storage pattern 145 may be configured such that a width of an upper portion thereof may be greater than a width of a lower portion thereof. Side surfaces of the second data storage pattern 145 may be inclined with respect to an upper surface of the substrate 2. A width of a lower portion of the second data storage pattern 145 may be greater than a width of an upper portion of the second lower data storage electrode 140 in the first direction (the X direction). Side surfaces of the second upper data storage electrode 148 may be inclined with respect to an upper surface of the substrate 2. Side surfaces of the second upper data storage electrode 148 may be coplanar with side surfaces of the second data storage pattern 145. A width of a lower portion of the second upper data storage electrode 148 may be the same as a width of an upper portion of the second data storage pattern 145.

The second selector structures 169 each may include a second lower selector electrode 160, a second selector pattern 163, a second upper selector electrode 166, and a second connection pattern 168 stacked in order in a third direction (the Z direction) perpendicular to an upper surface of the substrate 2. The second lower selector electrode 160 may be in contact with the second upper data storage electrode 148. The second upper selector electrode 166 may be electrically connected to the third conductive lines 175 through the second connection pattern 168. In an exemplary embodiment of the present inventive concept, the second connection pattern 168 may be omitted, and in this case, the second upper selector electrode 166 may be in contact with the third conductive line 175.

The second selector structure 169 may be configured such that a width of an upper portion thereof may be smaller than a width of a lower portion thereof. Side surfaces of the second selector structure 169 may be inclined with respect to an upper surface of the substrate 2. Side surfaces of the second lower selector electrode 160, side surfaces of the second selector pattern 163, side surfaces of the second upper selector electrode 166, and side surfaces of the second connection pattern 168 may be coplanar with one another. A width of an upper portion of the second upper data storage electrode 148 may be greater than a width of a lower portion of the second selector structure 169, e.g., a width of the second lower selector electrode 160, in the first direction (the X direction) and the second direction (the Y direction).

The third interlayer insulating layer 172 may be disposed around the second selector structures 169. A fourth interlayer insulating layer 178 may be disposed between the third conductive lines 175.

Figure 30:
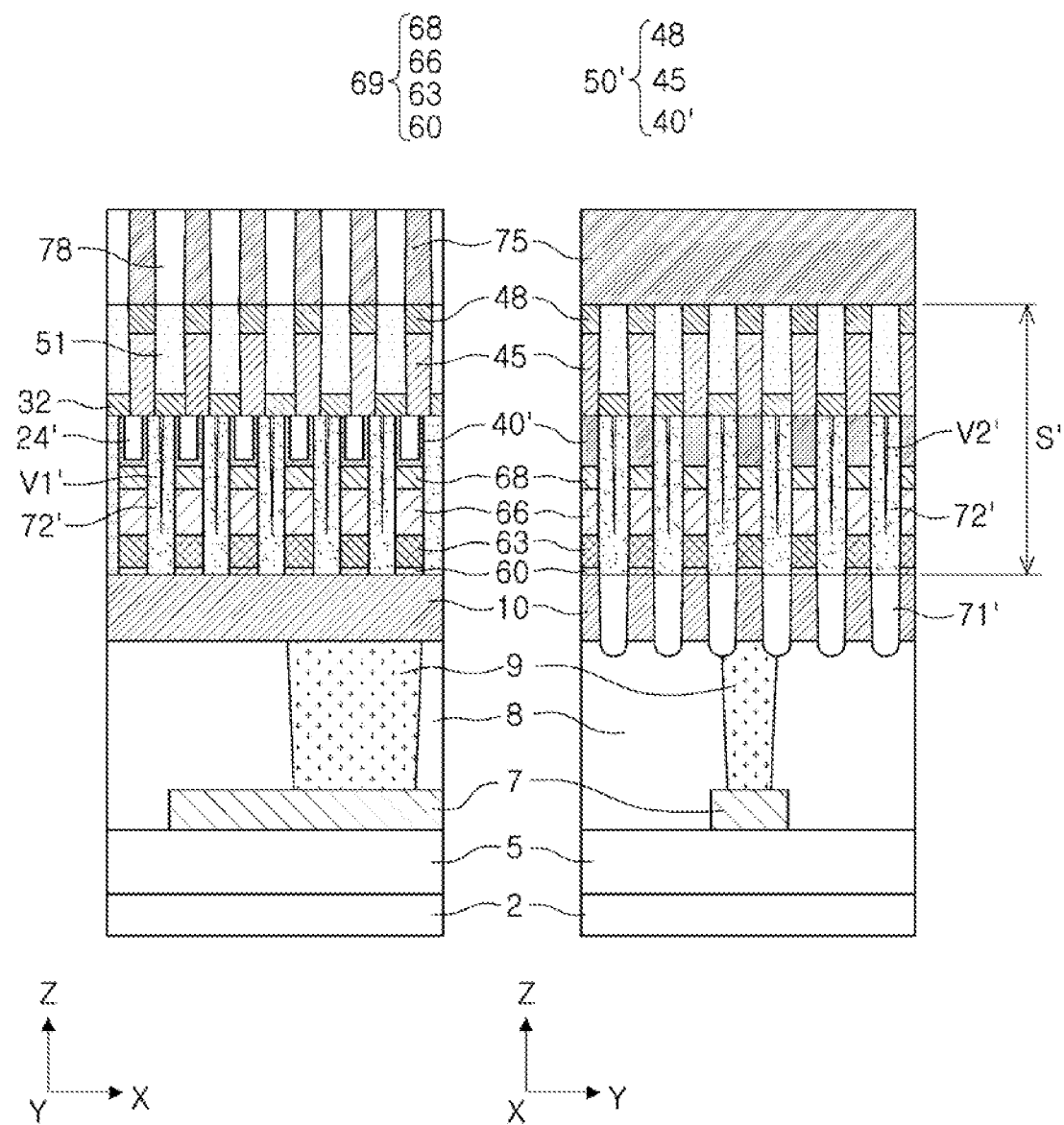
FIG. 30 includes cross-sectional diagrams illustrating a semiconductor device according to an exemplary embodiment of the present inventive concept.
Figure 31:
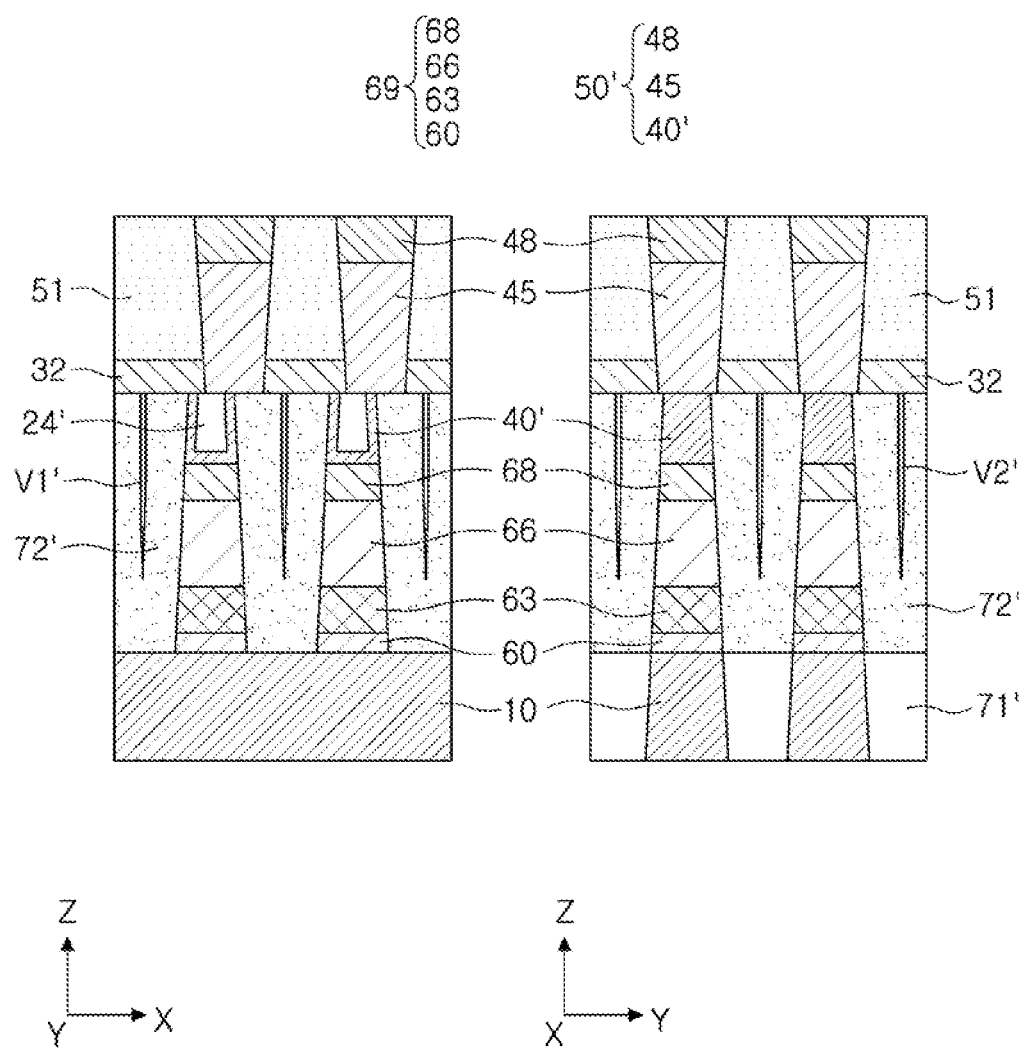
FIG. 31 includes cross-sectional diagrams illustrating partial regions illustrated in FIG. 30 in magnified form.

FIG. 30 includes cross-sectional diagrams illustrating a semiconductor device according to an exemplary embodiment of the present inventive concept. FIG. 31 includes cross-sectional diagrams illustrating partial regions illustrated in FIG. 30 in magnified form.

Referring to FIGS. 30 and 31, a memory region S' disposed between first conductive lines 10 and second conductive lines 75 may have a structure in which selector structures 69 are disposed below data storage structures 50', differently from the examples illustrated in FIGS. 2 and 3.

The data storage structure 50' may include a lower data storage electrode 40', a data storage pattern 45, and an upper data storage electrode 48. The selector structures 69 may include a lower selector electrode 60, a selector pattern 63, an upper selector electrode 66, and a connection pattern 68 stacked in order on the first conductive lines 10 in the third direction (the Z direction) perpendicular to an upper surface of the substrate 2.

The lower data storage electrode 40' may be disposed on the selector structure 69. A width of a lower portion of the selector structure 69 may be greater than a width of an upper portion of the selector structure 69. A width of an upper portion of the lower data storage electrode 40' may be smaller than a width of a lower portion of the lower data storage electrode 40'. A width of a lower portion of the lower data storage electrode 40' may be the same as a width of an upper portion of the selector structure 69. Side surfaces of the lower selector electrode 60, side surfaces of the selector pattern 63, side surfaces of the upper selector electrode 66, side surfaces of the connection pattern 68, and side surfaces of the lower data storage electrode 40' may be coplanar with one another. The lower data storage electrode 40' may cover side surfaces and a lower surface of a gap fill insulating pattern 24'.

Insulating patterns 71' may be disposed between the first conductive lines 10, and an interlayer insulating layer 72' may be disposed around the selector structures 69. The insulating patterns 71' may protrude into the second base insulating layer 8. A first void V1' and a second void V2' may be formed in the interlayer insulating layer 72'.

The data storage pattern 45 may penetrate through an etch stop layer 32 disposed on the interlayer insulating layer 72' and may be in contact with the lower data storage electrode 40'. A width of an upper portion of the data storage pattern 45 may be greater than a width of a lower portion of the data storage pattern 45. A width of a lower portion of the data storage pattern 45 may be greater than a width of an upper portion of the lower data storage electrode 40'.

The upper data storage electrode 48 may be disposed on the data storage pattern 45, and side surfaces of the upper data storage electrode 48 and side surfaces of the data storage pattern 45 may be coplanar with one another. A width of a lower portion of the upper data storage electrode 48 may be the same as a width of an upper portion of the data storage pattern 45. A mold insulating layer 51 may be disposed on the etch stop layer 32, and the mold insulating layer 51 may surround side surfaces of the upper data storage electrode 48 and side surfaces of the data storage pattern 45.

Figure 32:
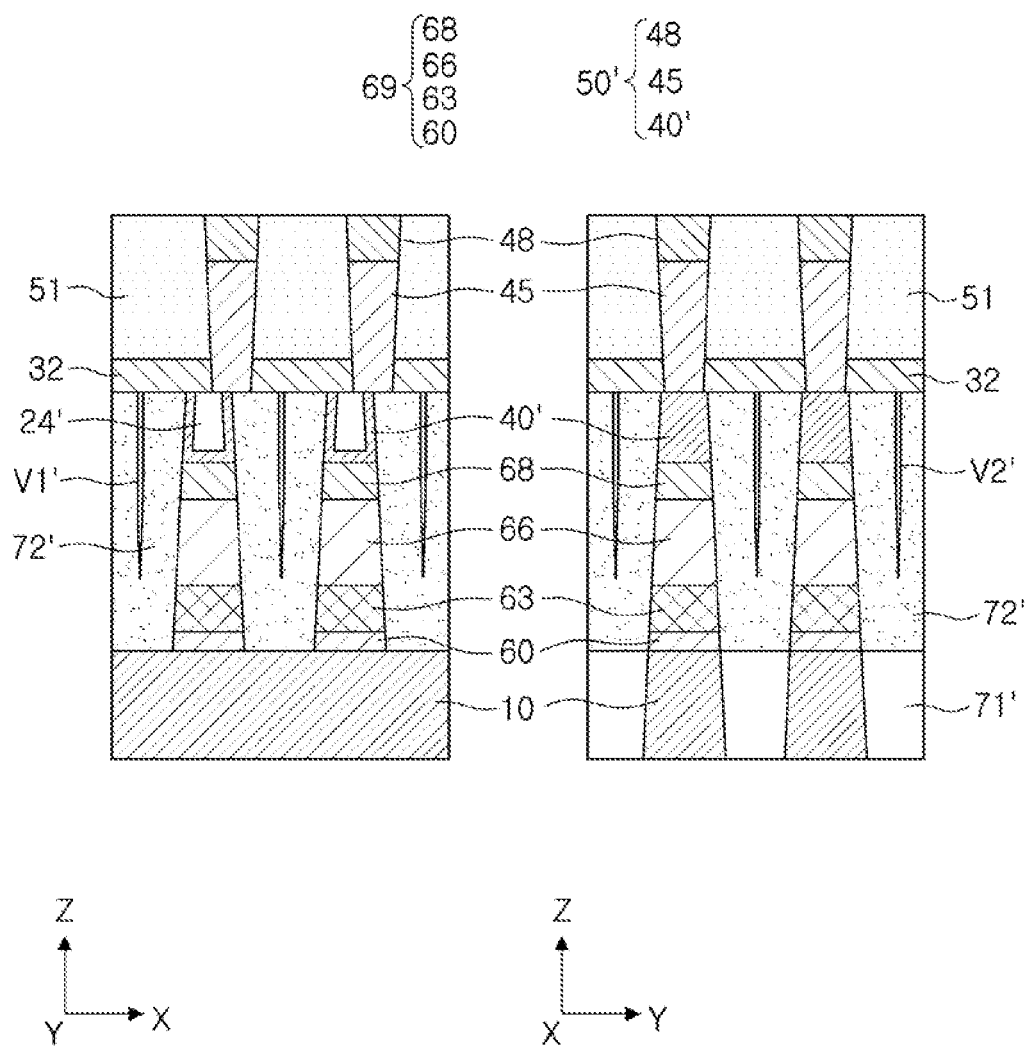
FIGS. 32 and 33 each include cross-sectional diagrams illustrating a semiconductor device according to an exemplary embodiment of the present inventive concept.
Figure 33:
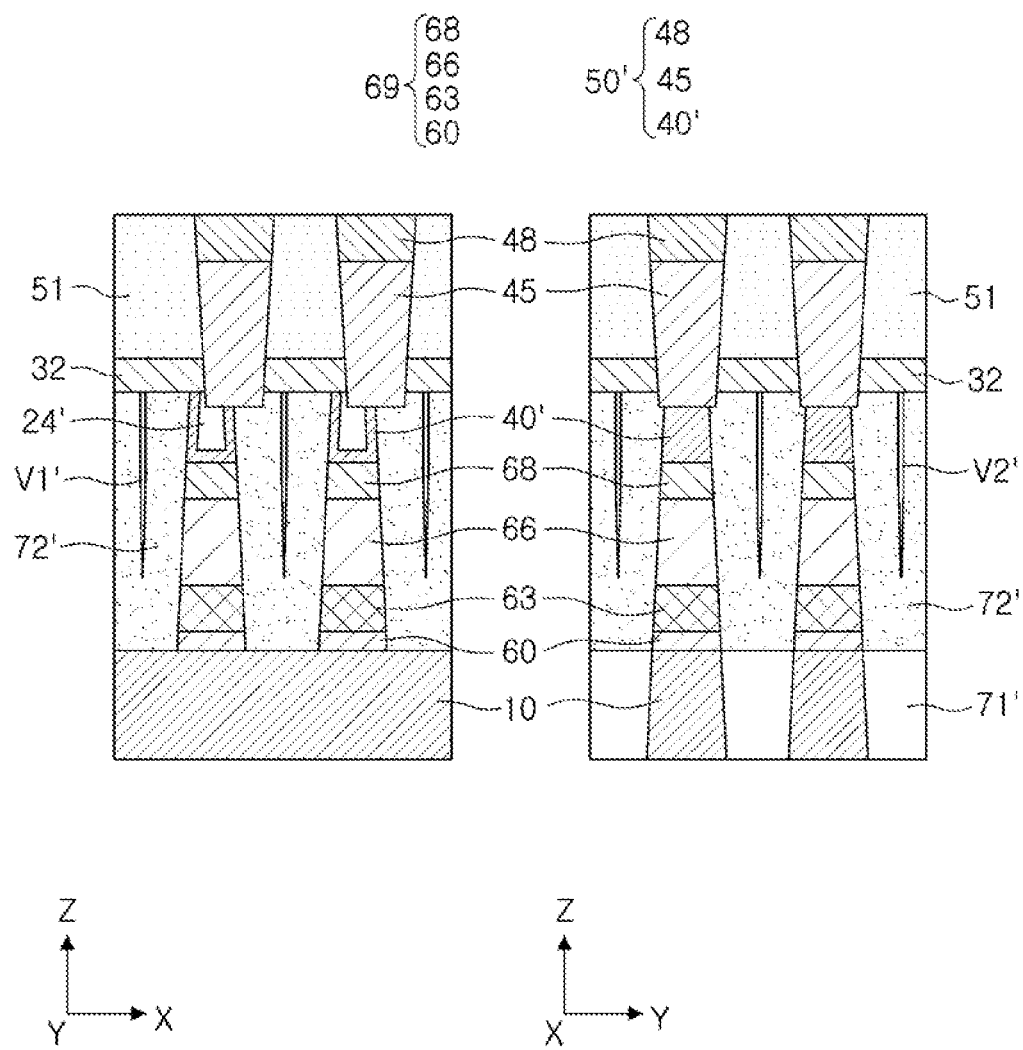

FIGS. 32 and 33 are cross-sectional diagrams illustrating a semiconductor device according to an exemplary embodiment of the present inventive concept.

FIGS. 32 and 33 are similar to FIG. 31, and thus, mostly differences will be described in the description below.

Referring to FIG. 32, widths of a data storage pattern 45 and an upper data storage electrode 48 may be smaller than the example illustrated in FIG. 31. A width of a lower portion of the data storage pattern 45 may be smaller than a width of an upper portion of a lower data storage electrode 40' in the second direction (the Y direction). A width of an upper portion of the upper data storage electrode 48 may be smaller than a width of a lower portion of a selector structure 69, e.g., a width of a lower selector electrode 60.

Referring to FIG. 33, a lower surface of a data storage pattern 45 may be lower than a lower surface of an etch stop layer 32, differently from the example illustrated in FIG. 31. In other words, the data storage pattern 45 may protrude further downward than a lower surface of the etch stop layer 32.

According to the aforementioned exemplary embodiments of the present inventive concept, data storage patterns each having a size of 20 nm or less may be formed.

Further, bridge defects between the upper data storage electrodes formed on the data storage patterns may be reduced or removed.

In addition, a semiconductor device having increased productivity and reliability may be provided.

While the present inventive concept has been shown and described with reference to exemplary embodiments thereof, it will be apparent to those skilled in the art that modifications and variations could be made thereto without departing from the scope of the present inventive concept as defined by the appended claims.

What is claimed is:

1. A semiconductor device, comprising:
first conductive lines disposed on a substrate and extending in a first direction parallel to an upper surface of the substrate;
second conductive lines disposed on the first conductive lines and extending in a second direction perpendicular to the first direction and parallel to the upper surface of the substrate;
first data storage structures disposed between the first conductive lines and the second conductive lines, wherein each of the first data storage structures includes a first lower data storage electrode, a first data storage pattern on the first lower data storage electrode, and a first upper data storage electrode on the first data storage pattern; and
a first etch stop layer adjacent to lower side surfaces of the first data storage pattern and extending in the first direction and the second direction,
wherein a width of an upper portion of the first lower data storage electrode is smaller than a width of a lower portion of the first lower data storage electrode in the second direction, a width of an upper portion of the first data storage pattern is greater than a width of a lower portion of the first data storage pattern in the second direction, and the width of the upper portion of the first lower data storage electrode is different from the width of the lower portion of the first data storage pattern in the second direction.

2. The semiconductor device of claim 1,
wherein a width of an upper portion of the first upper data storage electrode is greater than a width of a lower portion of the first upper data storage electrode in the second direction, and
wherein the width of the lower portion of the first upper data storage electrode is the same as the width of the upper portion of the first data storage pattern in the second direction.

3. The semiconductor device of claim 1, further comprising:
first selector structures disposed between the first conductive lines and the second conductive lines and connected to the first data storage structures in series.

4. The semiconductor device of claim 3,
wherein widths of upper portions of the first selector structures are smaller than widths of lower portions of the first selector structures in the second direction, and
wherein widths of lower portions of the first selector structures are different from a width of an upper portion of the first upper data storage electrode in the second direction.

5. The semiconductor device of claim 1, further comprising:
an insulating pattern disposed below the first etch stop layer, covering side surfaces of the first lower data storage electrode, and including a void.

6. The semiconductor device of claim 5, wherein the void is in contact with a lower surface of the first etch stop layer.

7. The semiconductor device of claim 1, wherein a lower end of the first data storage pattern is below a lower surface of the first etch stop layer.

8. The semiconductor device of claim 1, wherein the width of the lower portion of the first lower data storage electrode is the same as a width of an upper portion of one of the first conductive lines in the second direction.

9. The semiconductor device of claim 1, further comprising:
third conductive lines disposed on the second conductive lines and extending in the first direction;
second data storage structures disposed between the second conductive lines and the third conductive lines, wherein each of the second data storage structures includes a second lower data storage electrode, a second data storage pattern on the second lower data storage electrode, and a second upper data storage electrode on the second data storage pattern; and
a second etch stop layer adjacent to lower side surfaces of the second data storage pattern and extending in the first direction and the second direction,
wherein a width of an upper portion of the second lower data storage electrode is smaller than a width of a lower portion of the second lower data storage electrode in the first direction, a width of an upper portion of the second data storage pattern is greater than a width of a lower portion of the second data storage pattern in the first direction, and the width of the upper portion of the second lower data storage electrode is different from the width of the lower portion of the second data storage pattern in the first direction.

10. The semiconductor device of claim 9,
wherein a width of an upper portion of the second upper data storage electrode is greater than a width of a lower portion of the second upper data storage electrode in the first direction, and
wherein the width of the lower portion of the second upper data storage electrode is the same as the width of the upper portion of the second data storage pattern in the first direction.

11. The semiconductor device of claim 9, further comprising:
second selector structures disposed between the second conductive lines and the third conductive lines and connected to the second data storage structures in series.

12. The semiconductor device of claim 11,
wherein widths of upper portions of the second selector structures are smaller than widths of lower portions of the second selector structures in the second direction, and
wherein the widths of the lower portions of the second selector structures are different from a width of an upper portion of the second upper data storage electrode.

13. A semiconductor device, comprising:
a first conductive line disposed on a substrate and extending in a first direction parallel to an upper surface of the substrate;
a second conductive line disposed on the first conductive line and extending in a second direction perpendicular to the first direction and parallel to the upper surface of the substrate;
a first data storage structure and a first selector structure disposed between the first conductive line and the second conductive line and connected to each other in series; and
a first etch stop layer adjacent to side surfaces of the first data storage structure and extending in the first direction and the second direction,
wherein the first data storage structure includes a first lower data storage electrode, a first data storage pattern, and a first upper data storage electrode, and
wherein slopes of side surfaces of the first lower data storage electrode are different from slopes of side surfaces of the first data storage pattern, and a width of an upper portion of the first lower data storage electrode is different from a width of a lower portion of the first data storage pattern.

14. The semiconductor device of claim 13, wherein slopes of side surfaces of the first upper data storage electrode are the same as the slopes of the side surfaces of the first data storage pattern, and a width of a lower portion of the first upper data storage electrode is the same as a width of an upper portion of the first data storage pattern.

15. The semiconductor device of claim 13,
wherein each side surface of the first selector structure has a slope, and
wherein a width of a lower portion of the first selector structure is different from a width of an upper portion of the first upper data storage electrode.

16. The semiconductor device of claim 13, further comprising:
an insulating pattern disposed below the first etch stop layer, covering the side surfaces of the first lower data storage electrode, and including a void.

17. The semiconductor device of claim 16, wherein the void is in contact with a lower surface of the first etch stop layer.

18. A semiconductor device, comprising:
a first conductive line disposed on a substrate;
a second conductive line disposed on the substrate; and a data storage structure disposed between the first conductive line and the second conductive line, wherein the data storage structure includes a data storage pattern disposed between a first data storage electrode and a second data storage electrode, wherein the first data storage electrode is below the data storage pattern, and the second data storage electrode is above the data storage pattern, and wherein a width of a lower portion of the data storage pattern is greater than a width of an upper portion of the first data storage electrode, and wherein the data storage pattern is tapered.

19. The semiconductor device of claim 18, wherein the lower portion of the data storage pattern directly contacts the upper portion of the first data storage electrode.

20. The semiconductor device of claim 18, further comprising a selector pattern directly contacting the second data storage electrode.

* * * * *